(12) United States Patent
Hazelton

(10) Patent No.: US 7,355,308 B2
(45) Date of Patent: Apr. 8, 2008

(54) MOVER COMBINATION WITH TWO CIRCULATION FLOWS

(75) Inventor: Andrew J. Hazelton, San Carlos, CA (US)

(73) Assignee: Nikon Corporation, Tokyo (JP)

( * ) Notice: Subject to any disclaimer, the term of this patent is extended or adjusted under 35 U.S.C. 154(b) by 149 days.

(21) Appl. No.: 10/646,848

(22) Filed: Aug. 21, 2003

(65) Prior Publication Data

US 2005/0040712 A1 Feb. 24, 2005

(51) Int. Cl.
K02K 9/19 (2006.01)
H02K 41/00 (2006.01)

(52) U.S. Cl. ............................ 310/58; 310/12; 310/16; 310/59; 310/64

(58) Field of Classification Search ............ 310/52–58, 310/59–61, 64, 12, 16, 15; 505/878, 899
See application file for complete search history.

(56) References Cited

U.S. PATENT DOCUMENTS

| 853,465 | A | | 5/1907 | Mershon | |
|---|---|---|---|---|---|
| 3,188,833 | A | | 6/1965 | Robinson | |
| 3,318,253 | A | | 5/1967 | Campolong | |
| 3,743,867 | A | * | 7/1973 | Smith, Jr. .................... | 310/52 |
| 3,789,249 | A | | 1/1974 | Purman | |
| 3,805,101 | A | | 4/1974 | Purman | |
| 3,845,639 | A | * | 11/1974 | Smith et al. .................. | 62/505 |
| 3,852,627 | A | | 12/1974 | Davis | |
| 3,855,485 | A | | 12/1974 | Matsui et al. | |
| 3,906,261 | A | | 9/1975 | Ogura et al. | |
| 4,018,059 | A | | 4/1977 | Hatch | |
| 4,126,798 | A | * | 11/1978 | Carr et al. .................. | 310/204 |
| 4,155,019 | A | * | 5/1979 | Weghaupt .................... | 310/61 |
| 4,243,899 | A | | 1/1981 | Jaffe | |
| 4,295,068 | A | * | 10/1981 | Gamble ........................ | 310/52 |
| 4,386,289 | A | * | 5/1983 | Intichar et al. ............... | 310/52 |
| 4,389,585 | A | * | 6/1983 | Yamaguchi et al. .......... | 310/52 |
| 4,460,855 | A | | 7/1984 | Kelly | |
| 4,565,601 | A | * | 1/1986 | Kakehi et al. ................ | 216/59 |
| 4,625,132 | A | | 11/1986 | Chitayat | |

(Continued)

FOREIGN PATENT DOCUMENTS

EP 1124160 A2 8/2001

(Continued)

OTHER PUBLICATIONS

U.S. Appl. No. 09/139,954, filed Aug. 25, 1998, Teng et al.

Primary Examiner—Tran Nguyen
(74) Attorney, Agent, or Firm—Steven G. Roeder; James P. Broder

(57) ABSTRACT

A circulation system (330) for a mover (328) includes a fluid source (360) that directs a first fluid (356) into a first inlet (364A) of the mover (328) and a second fluid (358) into a second inlet (366A) of the mover (328). In one embodiment, a temperature of the second fluid (358) at the second inlet (366A) is different than a temperature of the first fluid (356) at the first inlet (364A). For example, in one embodiment, the temperature of the second fluid (358) at the second inlet (366A) is approximately at the boiling temperature of the second fluid (358). In an alternative embodiment, the mover (428) includes a heat transferer (469) that transfers heat from a second passageway (466).

61 Claims, 19 Drawing Sheets

Fig. 3B

U.S. PATENT DOCUMENTS

| | | | |
|---|---|---|---|
| 4,764,696 A * | 8/1988 | Fukaya et al. | 310/49 R |
| 5,032,748 A * | 7/1991 | Sakuraba et al. | 310/52 |
| 5,138,206 A | 8/1992 | Schmidt | |
| 5,157,296 A | 10/1992 | Trumper | |
| 5,196,754 A | 3/1993 | Berthold et al. | |
| 5,271,248 A * | 12/1993 | Crowe | 62/505 |
| 5,294,854 A | 3/1994 | Trumper | |
| 5,382,311 A | 1/1995 | Ishikawa et al. | |
| 5,434,549 A | 7/1995 | Hirabayashi et al. | |
| 5,521,570 A * | 5/1996 | Ito et al. | 335/216 |
| 5,622,593 A | 4/1997 | Arasawa et al. | |
| 5,698,070 A | 12/1997 | Hirano | |
| 5,699,621 A | 12/1997 | Trumper et al. | |
| 5,705,029 A * | 1/1998 | Okudaira et al. | 438/715 |
| 5,777,403 A | 7/1998 | Yuan | |
| 5,783,877 A | 7/1998 | Chitayat | |
| 5,959,732 A | 9/1999 | Hara et al. | |
| 5,998,889 A | 12/1999 | Novak | |
| 6,069,417 A | 5/2000 | Yuan et al. | |
| 6,084,319 A | 7/2000 | Kamata et al. | |
| 6,114,781 A | 9/2000 | Hazelton et al. | |
| 6,130,517 A | 10/2000 | Yuan et al. | |
| 6,278,203 B1 | 8/2001 | Novak et al. | |
| 6,313,556 B1 * | 11/2001 | Dombrovski et al. | 310/91 |
| 6,323,567 B1 | 11/2001 | Hazelton et al. | |
| 6,351,045 B1 * | 2/2002 | Shoykhet | 310/52 |
| 6,472,777 B1 | 10/2002 | Teng et al. | |
| 6,536,218 B1 * | 3/2003 | Steinmeyer | 62/6 |
| 6,583,525 B2 | 6/2003 | Dyer et al. | |
| 6,770,987 B1 * | 8/2004 | Sogard et al. | 310/12 |
| 6,812,601 B2 * | 11/2004 | Gamble et al. | 310/52 |
| 6,825,583 B2 * | 11/2004 | Joung et al. | 310/16 |
| 6,956,308 B2 * | 10/2005 | Binnard | 310/52 |
| 2005/0012403 A1 | 1/2005 | Binnard | |

FOREIGN PATENT DOCUMENTS

| | | |
|---|---|---|
| JP | 05-45102 | 8/1989 |
| JP | 06-062786 | 1/1993 |
| JP | 05219717 A * | 8/1993 |
| JP | 05-262222 | 10/1993 |
| JP | 05344705 A * | 12/1993 |
| JP | 10-313568 | 11/1998 |
| JP | 2001-025227 | 1/2001 |
| JP | 2001-275334 | 10/2001 |
| JP | 2002-10618 | 1/2002 |
| JP | 2002-301742 | 10/2002 |

* cited by examiner

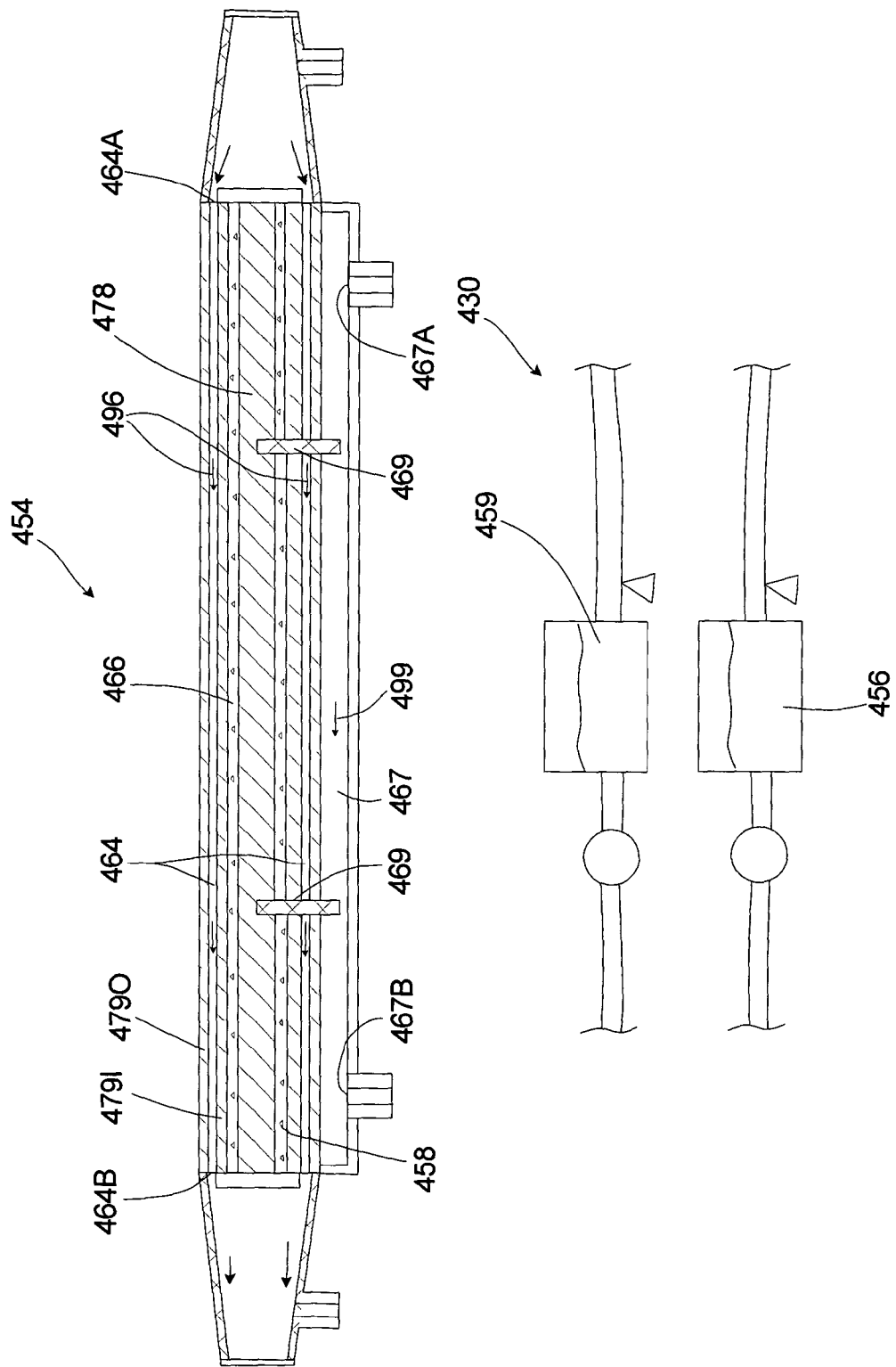

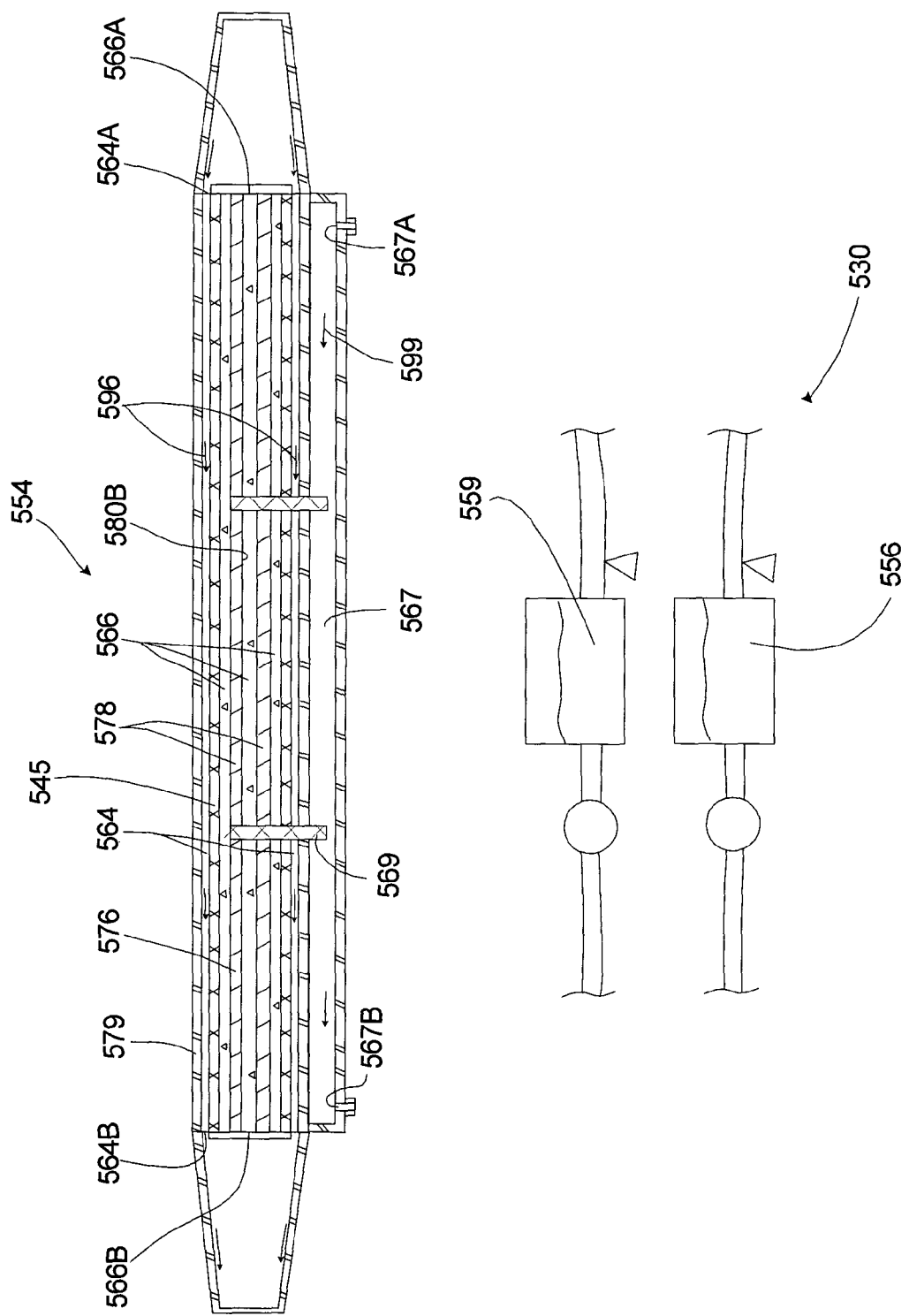

MOVER COMBINATION WITH TWO CIRCULATION FLOWS

FIELD OF THE INVENTION

The present invention relates to a circulation system for a mover. The circulation system can be used to control the temperature of the mover and/or to control the thermal influence of the mover on the surrounding environment and the surrounding components.

BACKGROUND

Exposure apparatuses for semiconductor processing are commonly used to transfer images from a reticle onto a semiconductor wafer. Typically, the exposure apparatus utilizes one or more movers to precisely position a reticle stage retaining the reticle and a wafer stage holding the semiconductor wafer. Additionally, the exposure apparatus can include a vibration isolation system that includes one or more movers. The images transferred onto the wafer from the reticle are extremely small. Accordingly, the precise positioning of the wafer and the reticle is critical to the manufacturing of the wafer. In order to obtain precise relative alignment, the position of the reticle and the wafer are constantly monitored by a measurement system. Subsequently, with the information from the measurement system, the reticle and/or wafer are moved by the one or more movers to obtain relative alignment.

One type of mover is a linear motor that includes a pair of spaced apart magnet arrays that generate a magnetic field and a conductor array positioned between the magnet arrays. An electrical current is directed to the conductor array. The electrical current supplied to the conductor array generates an electromagnetic field that interacts with the magnetic field of the magnet arrays. This causes the conductor array to move relative to the magnet arrays. When the conductor array is secured to one of the stages, that stage moves in concert with the conductor array.

Unfortunately, the electrical current supplied to the conductor array also generates heat, due to resistance in the conductor array. Most linear movers are not actively cooled. Thus, the heat from the conductor array is subsequently transferred to the surrounding environment, including the air surrounding the linear motor and the other components positioned near the linear motor. The heat changes the index of refraction of the surrounding air. This reduces the accuracy of the measurement system and degrades machine positioning accuracy. Further, the heat causes expansion of the other components of the machine. This further degrades the accuracy of the machine. Moreover, the resistance of the conductor increases as temperature increases. This exacerbates the heating problem and reduces the performance and life of the linear motor.

In light of the above, there is a need for a system and method for maintaining an outer surface of a mover at a set temperature during operation. Additionally, there is a need for a system for cooling a conductor array of a mover. Moreover, there is a need for an exposure apparatus capable of manufacturing precision devices such as high density semiconductor wafers.

SUMMARY

The present invention is directed to a circulation system for a mover. In one embodiment, the mover includes a first passageway having a first inlet, and a second passageway having a second inlet. In this embodiment, the circulation system includes a fluid source that directs a first fluid into the first inlet and a second fluid into the second inlet. Further, a temperature of the second fluid at the second inlet is approximately equal to the boiling temperature of the second fluid at the absolute pressure within the second passageway.

The circulation system can be used with a linear motor, a non-commutated voice coil mover, a planar motor, or another type of actuator.

The present invention is also directed to a mover combination that includes (i) a mover having a magnet component and a conductor component and (ii) the circulation system described above. In one embodiment, the mover is positioned in a room that is at a room temperature, and the temperature of the first fluid at the first inlet is controlled to be approximately equal to the room temperature. For example, the room temperature can be between approximately 20 and 25 degrees C.

Additionally, the present invention is directed to a mover combination that includes a mover having a conductor component, a fluid source and a heat transferrer. In this embodiment, the mover includes a first passageway, and a sealed second passageway. Further, the heat transferer transfers heat from the conductor component. In one embodiment, the mover includes a third passageway and the heat transferer transfers heat from the conductor component to the first passageway.

The present invention is also directed to (i) an isolation system including the mover combination, (ii) a stage assembly including the mover combination, (iii) an exposure apparatus including the mover combination, and (iv) an object or wafer on which an image has been formed by the exposure apparatus. Further, the present invention is also directed to (i) a method for making a circulation system, (ii) a method for making a mover combination, (iii) a method for making a stage assembly, (iv) a method for manufacturing an exposure apparatus, and (v) a method for manufacturing an object or a wafer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 4B is a cut-away view of the conductor component taken on line 4B-4B of FIG. 4A and the circulation system;

FIG. 5B is a cut-away view of still another embodiment of a conductor component and a circulation system;

DESCRIPTION

Figure 1:
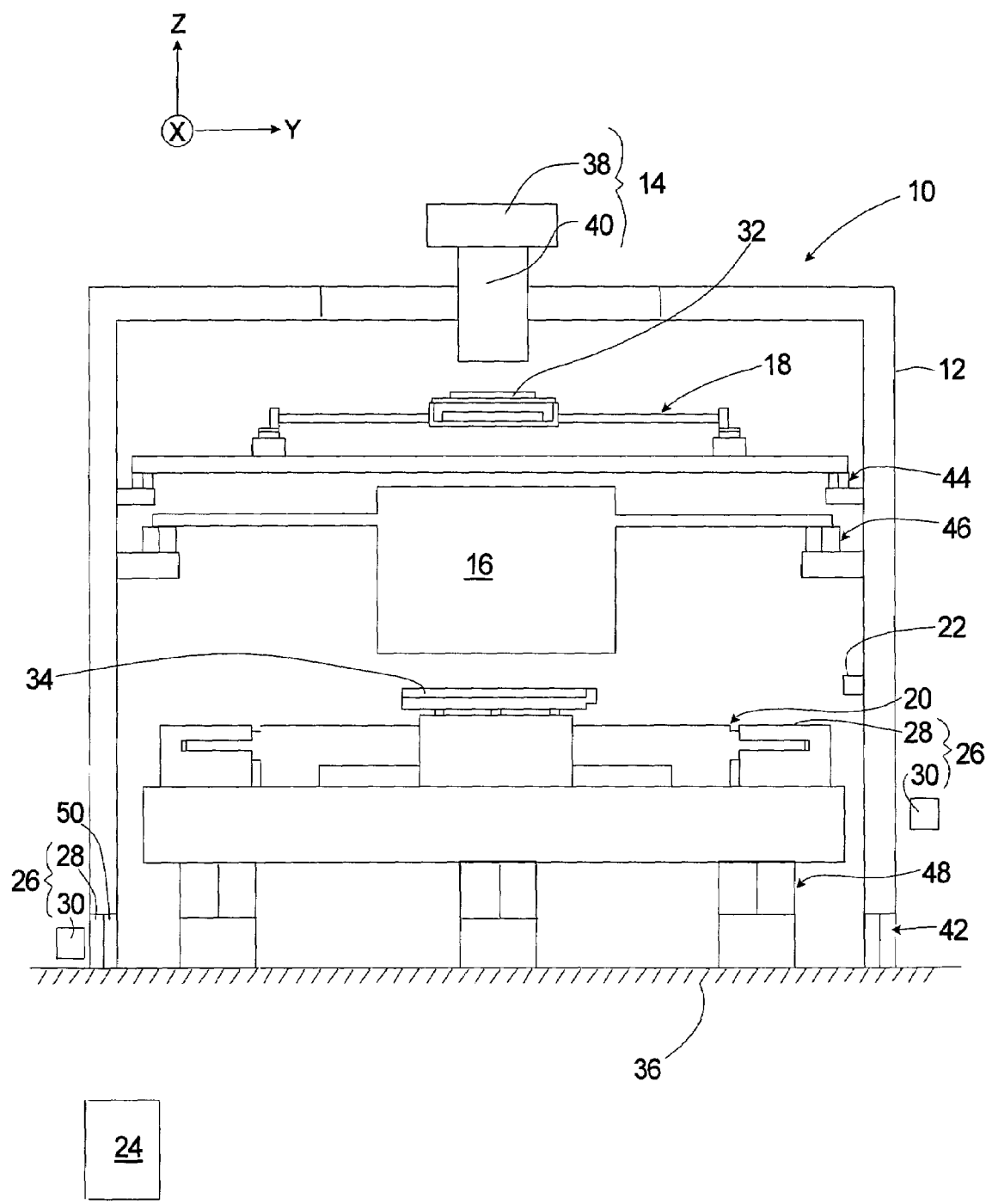
FIG. 1 is a schematic illustration of an exposure apparatus having features of the present invention.

FIG. 1 is a schematic illustration of a precision assembly, namely an exposure apparatus 10 having features of the present invention. The exposure apparatus 10 includes an apparatus frame 12, an illumination system 14 (irradiation apparatus), an optical assembly 16, a reticle stage assembly 18, a wafer stage assembly 20, a measurement system 22, and a control system 24. The design of the components of the exposure apparatus 10 can be varied to suit the design requirements of the exposure apparatus 10.

As provided herein, one or both of the stage assemblies 18, 20 can include a mover combination 26 having one or more movers 28 and one or more circulation systems 30 (illustrated as a box in FIG. 1). In one embodiment, the circulation system 30 reduces the amount of heat transferred from the one or more movers 28 to the surrounding environment. With this design, the movers 28 can be placed closer to the measurement system 22 and/or the influence of the movers 28 on the accuracy of the measurement system 22 is reduced. Further, the exposure apparatus 10 is capable of manufacturing higher precision devices, such as higher density, semiconductor wafers.

A number of Figures include an orientation system that illustrates an X axis, a Y axis that is orthogonal to the X axis and a Z axis that is orthogonal to the X and Y axes. It should be noted that these axes can also be referred to as the first, second and third axes.

The exposure apparatus 10 is particularly useful as a lithographic device that transfers a pattern (not shown) of an integrated circuit from a reticle 32 onto a semiconductor wafer 34. The exposure apparatus 10 mounts to a mounting base 36, e.g., the ground, a base, or floor or some other supporting structure.

There are a number of different types of lithographic devices. For example, the exposure apparatus 10 can be used as a scanning type photolithography system that exposes the pattern from the reticle 32 onto the wafer 34 with the reticle 32 and the wafer 34 moving synchronously. In a scanning type lithographic device, the reticle 32 is moved perpendicularly to an optical axis of the optical assembly 16 by the reticle stage assembly 18 and the wafer 34 is moved perpendicularly to the optical axis of the optical assembly 16 by the wafer stage assembly 20. Scanning of the reticle 32 and the wafer 34 occurs while the reticle 32 and the wafer 34 are moving synchronously.

Alternatively, the exposure apparatus 10 can be a step-and-repeat type photolithography system that exposes the reticle 32 while the reticle 32 and the wafer 34 are stationary. In the step and repeat process, the wafer 34 is in a constant position relative to the reticle 32 and the optical assembly 16 during the exposure of an individual field. Subsequently, between consecutive exposure steps, the wafer 34 is consecutively moved with the wafer stage assembly 20 perpendicularly to the optical axis of the optical assembly 16 so that the next field of the wafer 34 is brought into position relative to the optical assembly 16 and the reticle 32 for exposure. Following this process, the images on the reticle 32 are sequentially exposed onto the fields of the wafer 34, and then the next field of the wafer 34 is brought into position relative to the optical assembly 16 and the reticle 32.

However, the use of the exposure apparatus 10 provided herein is not limited to a photolithography system for semiconductor manufacturing. The exposure apparatus 10, for example, can be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern from a mask to a substrate with the mask located close to the substrate without the use of a lens assembly.

The apparatus frame 12 is rigid and supports the components of the exposure apparatus 10. The apparatus frame 12 illustrated in FIG. 1 supports the reticle stage assembly 18, the optical assembly 16 and the illumination system 14 above the mounting base 36.

The illumination system 14 includes an illumination source 38 and an illumination optical assembly 40. The illumination source 38 emits a beam (irradiation) of light energy. The illumination optical assembly 40 guides the beam of light energy from the illumination source 38 to the optical assembly 16. The beam illuminates selectively different portions of the reticle 32 and exposes the wafer 34. In FIG. 1, the illumination source 38 is illustrated as being supported above the reticle stage assembly 18. Typically, however, the illumination source 38 is secured to one of the sides of the apparatus frame 12 and the energy beam from the illumination source 38 is directed to above the reticle stage assembly 18 with the illumination optical assembly 40.

The illumination source 38 can be a g-line source (436 nm), an i-line source (365 nm), a KrF excimer laser (248 nm), an ArF excimer laser (193 nm) or a $F_2$ laser (157 nm). Alternatively, the illumination source 38 can generate charged particle beams such as an x-ray or an electron beam. For instance, in the case where an electron beam is used, thermionic emission type lanthanum hexaboride ($LaB_6$) or tantalum (Ta) can be used as a cathode for an electron gun. Furthermore, in the case where an electron beam is used, the structure could be such that either a mask is used or a pattern can be directly formed on a substrate without the use of a mask.

The optical assembly 16 projects and/or focuses the light passing through the reticle 32 to the wafer 34. Depending upon the design of the exposure apparatus 10, the optical assembly 16 can magnify or reduce the image illuminated on the reticle 32. The optical assembly 16 need not be limited to a reduction system. It could also be a 1× or magnification system.

When far ultra-violet rays such as the excimer laser is used, glass materials such as quartz and fluorite that transmit far ultra-violet rays can be used in the optical assembly 16. When the $F_2$ type laser or x-ray is used, the optical assembly 16 can be either catadioptric or refractive (a reticle should also preferably be a reflective type), and when an electron beam is used, electron optics can consist of electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No.8-171054 published in the Official Gazette for Laid-Open Patent Applications and its counterpart U.S. Pat. No. 5,668,672, as well as Japan Patent Application Disclosure No. 10-20195 and its counterpart U.S. Pat. No. 5,835,275. In these cases, the reflecting optical device can be a catadioptric optical system incorporating a beam splitter and concave mirror. Japan Patent Application Disclosure No.8-334695 published in the Official Gazette for Laid-Open Patent Applications and its counterpart U.S. Pat. No. 5,689,377 as well as Japan Patent Application Disclosure No. 10-3039 and its counterpart U.S. patent application Ser. No. 873,605 (Application Date: Jun. 12, 1997) also use a reflecting-refracting type of optical system incorporating a concave mirror, etc., but without a beam splitter, and can also be employed with this invention. As far as is permitted, the disclosures in the above-mentioned U.S. patents, as well as the Japan patent applications published in the Official Gazette for Laid-Open Patent Applications are incorporated herein by reference.

The reticle stage assembly 18 holds and positions the reticle 32 relative to the optical assembly 16 and the wafer 34. Somewhat similarly, the wafer stage assembly 20 holds and positions the wafer 34 with respect to the projected image of the illuminated portions of the reticle 32. The wafer stage assembly 20 is described in more detail below.

Further, in photolithography systems, when linear motors (see U.S. Pat. Nos. 5,623,853 or 5,528,118) are used in a wafer stage or a mask stage, the linear motors can be either an air levitation type employing air bearings or a magnetic levitation type using Lorentz force or reactance force. Additionally, the stage could move along a guide, or it could be a guideless type stage that uses no guide. As far as is permitted, the disclosures in U.S. Pat. Nos. 5,623,853 and 5,528,118 are incorporated herein by reference.

Alternatively, one of the stages could be driven by a planar motor, which drives the stage by an electromagnetic force generated by a magnet unit having two-dimensionally arranged magnets and an armature coil unit having two-dimensionally arranged coils in facing positions. With this type of driving system, either the magnet unit or the armature coil unit is connected to the stage and the other unit is mounted on the moving plane side of the stage.

Movement of the stages as described above generates reaction forces that can affect performance of the photolithography system. Reaction forces generated by the wafer (substrate) stage motion can be mechanically transferred to the floor (ground) by use of a frame member as described in U.S. Pat. No. 5,528,100 and published Japanese Patent Application Disclosure No. 8-136475. Additionally, reaction forces generated by the reticle (mask) stage motion can be mechanically transferred to the floor (ground) by use of a frame member as described in U.S. Pat. No. 5,874,820 and published Japanese Patent Application Disclosure No. 8-330224. As far as is permitted, the disclosures in U.S. Pat. Nos. 5,528,100 and 5,874,820 and Japanese Patent Application Disclosure No. 8-330224 are incorporated herein by reference.

The measurement system 22 monitors movement of the reticle 32 and the wafer 34 relative to the optical assembly 16 or some other reference. With this information, the control system 24 can control the reticle stage assembly 18 to precisely position the reticle 32 and the wafer stage assembly 20 to precisely position the wafer 34. For example, the measurement system 22 can utilize multiple laser interferometers, encoders, and/or other measuring devices.

The control system 24 that is connected to the measurement system 22 and receives information from the measurement system 22 and controls the stage mover assemblies 18, 20 to precisely position the reticle 32 and the wafer 34. Further, the control system 24 that is connected to the circulation system(s) 30 and controls the circulation system (s) 30 to control the temperature of the mover(s) 28. The control system 24 can include one or more processors and circuits for performing the functions described herein.

Additionally, the exposure apparatus 10 can include one or more isolation systems that include a mover combination 26 having features of the present invention. For example, in FIG. 1, the exposure apparatus 10 includes (i) a frame isolation system 42 that secures the apparatus frame 12 to the mounting base 36 and reduces the effect of vibration of the mounting base 36 causing vibration to the apparatus frame 12, (ii) a reticle stage isolation system 44 that secures and supports the reticle stage assembly 18 to the apparatus frame 12 and reduces the effect of vibration of the apparatus frame 12 causing vibration to the reticle stage assembly 18, (iii) an optical isolation system 46 that secures and supports the optical assembly 16 to the apparatus frame 12 and reduces the effect of vibration of the apparatus frame 12 causing vibration to the optical assembly 16, and (iv) a wafer stage isolation system 48 that secures and supports the wafer stage assembly 20 to the mounting base 36 and reduces the effect of vibration of the mounting base 36 causing vibration to the wafer stage assembly 20. In this embodiment, each isolation system 42-48 can include (i) one or more pneumatic cylinders 50 that isolate vibration, and/or (ii) one or more mover combinations 26 made pursuant to the present invention that isolate vibration and control the position of the respective apparatus.

A photolithography system (an exposure apparatus) according to the embodiments described herein can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 2:
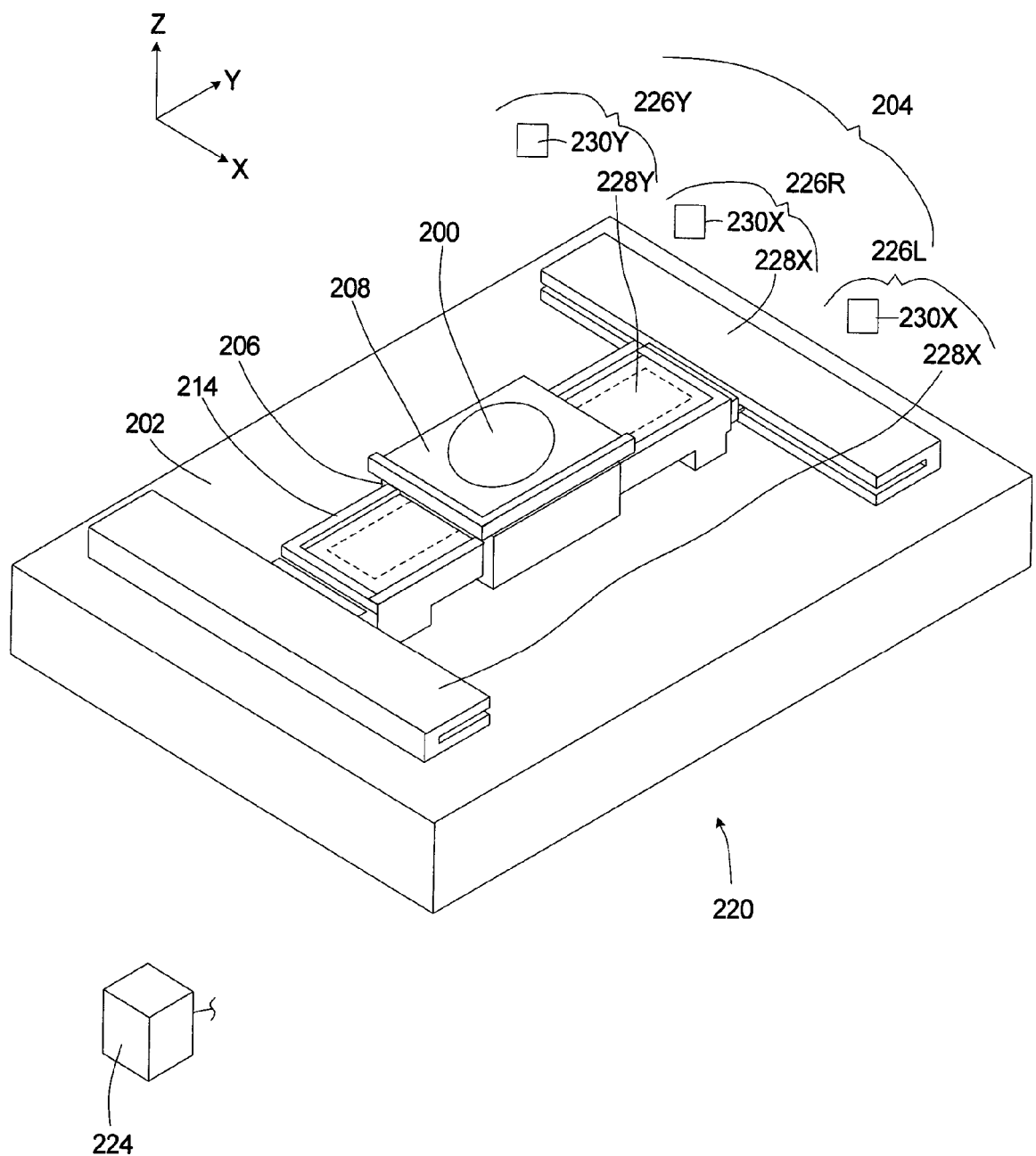
FIG. 2 is a perspective view of a stage assembly including a plurality of mover combinations having features of the present invention.

FIG. 2 is a perspective view of a control system 224 and a stage assembly 220 that is used to position a device 200. For example, the stage assembly 220 can be used as the wafer stage assembly 20 in the exposure apparatus 10 of FIG. 1. In this embodiment, the stage assembly 220 would position the wafer 34 (illustrated in FIG. 1) during manufacturing of the semiconductor wafer 34. Alternatively, the stage assembly 220 can be used to move other types of devices 200 during manufacturing and/or inspection, to move a device under an electron microscope (not shown), or to move a device during a precision measurement operation (not shown). For example, the stage assembly 220 could be designed to function as the reticle stage assembly 18.

The stage assembly 220 includes a stage base 202, a stage mover assembly 204, a stage 206, and a device table 208. The design of the components of the stage assembly 220 can be varied. For example, in FIG. 2, the stage assembly 220 includes one stage 206. Alternatively, however, the stage assembly 220 could be designed to include more than one stage 206.

In FIG. 2, the stage base 202 is generally rectangular shaped. Alternatively, the stage base 202 can be another shape. The stage base 202 supports some of the components of the stage assembly 220 above the mounting base 36.

The stage mover assembly 204 controls and moves the stage 206 and the device table 208 relative to the stage base 202. For example, the stage mover assembly 204 can move the stage 206 with three degrees of freedom, less than three degrees of freedom, or six degrees of freedom relative to the stage base 202. The stage mover assembly 204 can include one or more movers, such as rotary motors, voice coil motors, linear motors utilizing a Lorentz force to generate drive force, electromagnetic movers, planar motor, or some other force movers.

In FIG. 2, the stage mover assembly 204 includes a left X stage mover combination 226L, a right X stage mover combination 226R, a guide bar 214, and a Y stage mover combination 226Y. Each X stage mover combination 226L, 226R includes an X mover 228X and an X circulation system 230X (illustrated as a box); and the Y stage mover combination 226Y includes a Y mover 228Y and a Y circulation system 230Y (illustrated as a box).

The X movers 228X move the guide bar 214, the stage 206 and the device table 208 with a relatively large displacement along the X axis and with a limited range of motion about the Z axis, and the Y mover 228Y moves the stage 206 and the device table 208 with a relatively large displacement along the Y axis relative to the guide bar 214.

The design of each mover 228X, 228Y can be varied to suit the movement requirements of the stage assembly 220. For example, each of the movers 228X, 228Y can include one or more rotary motors, voice coil motors, linear motors utilizing a Lorentz force to generate drive force, electromagnetic movers, or some other force movers. In the embodiment illustrated in FIG. 2, each of the movers 228X, 228Y is a linear motor.

In one embodiment, (i) for each X stage mover combination 226L, 226R, the X circulation system 230X can be used to reduce the amount of heat transfer from the respective X mover 228X to the surrounding environment; and/or (ii) the Y circulation system 230Y can be used to reduce the amount of heat transfer from the Y mover 228Y to the surrounding environment.

The guide bar 214 guides the movement of the stage 206 along the Y axis. In FIG. 2, the guide bar 214 is somewhat rectangular beam shaped. A bearing (not shown) maintains the guide bar 214 spaced apart along the Z axis relative to the stage base 202 and allows for motion of the guide bar 214 along the X axis and about the Z axis relative to the stage base 202. The bearing can be a vacuum preload type fluid bearing that maintains the guide bar 214 spaced apart from the stage base 202 in a non-contact manner. Alternatively, for example, a magnetic type bearing or a ball bearing type assembly could be utilized that allows for motion of the guide bar 214 relative to the stage base 202.

In FIG. 2, the stage 206 moves with the guide bar 214 along the X axis and about the Z axis and the stage 206 moves along the Y axis relative to the guide bar 214. In this embodiment, the stage 206 is generally rectangular shaped and includes a rectangular shaped opening for receiving the guide bar 214. A bearing (not shown) maintains the stage 206 spaced apart along the Z axis relative to the stage base 202 and allows for motion of the stage 206 along the X axis, along the Y axis and about the Z axis relative to the stage base 202. The bearing can be a vacuum preload type fluid bearing that maintains the stage 206 spaced apart from the stage base 202 in a non-contact manner. Alternatively, for example, a magnetic type bearing or a ball bearing type assembly could be utilized that allows for motion of the stage 206 relative to the stage base 202.

Further, the stage 206 is maintained apart from the guide bar 214 with opposed bearings (not shown) that allow for motion of the stage 206 along the Y axis relative to the guide bar 214, while inhibiting motion of the stage 206 relative to the guide bar 214 along the X axis and about the Z axis. Each bearing can be a fluid bearing that maintains the stage 206 spaced apart from the guide bar 214 in a non-contact manner. Alternatively, for example, a magnetic type bearing or a ball bearing type assembly could be utilized that allows for motion of the stage 206 relative to the guide bar 214.

In the embodiment illustrated in the FIG. 2, the device table 208 is generally rectangular plate shaped and includes a clamp that retains the device 200. Further, the device table 208 is fixedly secured to the stage 206 and moves concurrently with the stage 206. Alternatively, for example, the stage mover assembly 204 can include a table mover assembly (not shown) that moves and adjusts the position of the device table 208 relative to the stage 206. For example, the table mover assembly can adjust the position of the device table 208 relative to the stage 206 with six degrees of freedom. Alternatively, for example, the table mover assembly can move the device table 208 relative to the stage 206 with only three degrees of freedom.

Figure 3A:
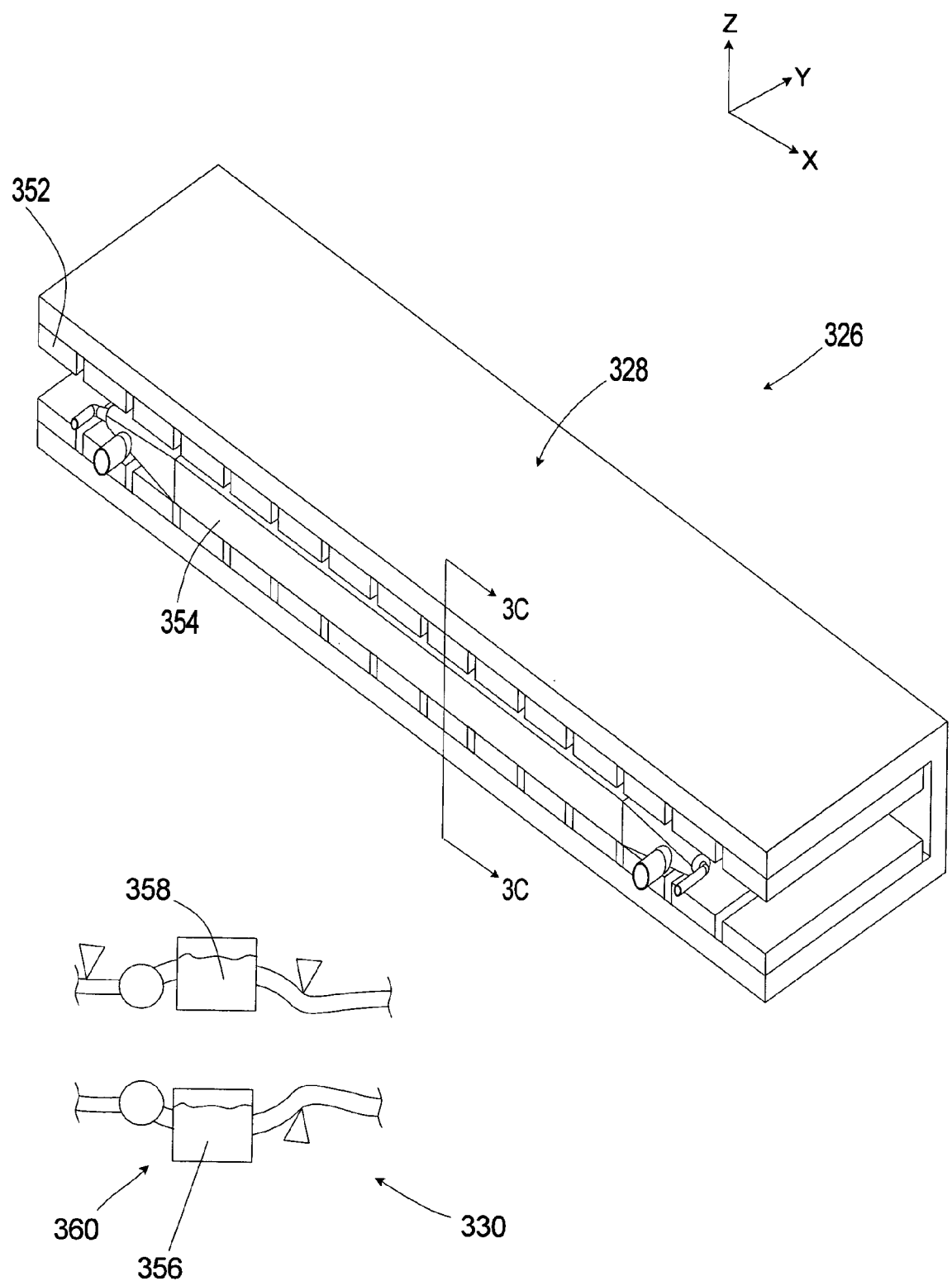
FIG. 3A is a perspective view of a mover combination having features of the present invention.

In FIG. 3A, the mover combination 326 includes one mover 328 and one circulation system 330. Alternatively, for example, the mover combination 326 can include two or more movers 328 and/or two or more circulation systems 330. The design of each of these components can be varied to suit the requirements of the mover combination 326.

In FIG. 3A, the mover combination 326 includes one mover 328 and one circulation system 330. Alternatively, for example, the motor combination 326 can include two or more movers 328 and/or two of more circulation systems 330. The design of each of these components can be varied to suit the requirement of the mover combination 326.

FIG. 3A illustrates a first embodiment of the mover 328. In this embodiment, the mover 328 is a linear motor and includes a magnet component 352, and a conductor component 354 that interacts with the magnet component 352. The design of these components can be varied. In FIG. 3A, the conductor component 354 moves linearly along the X axis relative to the stationary magnet component 352. Alternatively, for example, the mover 328 could be designed so that the magnet component 352 moves relative to a stationary conductor component 354.

The circulation system 330 directs a first fluid 356 and a second fluid 358 to the mover 328. With this design, in one embodiment, the circulation system 330 can be used to reduce the amount of heat transferred from the mover 328 to the environment that surrounds the mover 328. In one embodiment, the circulation system 330 can be used to maintain a portion or the entire outer surface of the mover 328 and/or the conductor component 354 at a set temperature. This reduces the influence of the mover 328 on the temperature of the environment surrounding the mover 328 and allows for more accurate positioning by the mover 328.

In one embodiment, the circulation system 330 includes a fluid source 360 that directs the first fluid 356 and the second fluid 358 separately and independently to the mover 328.

Figure 3B:
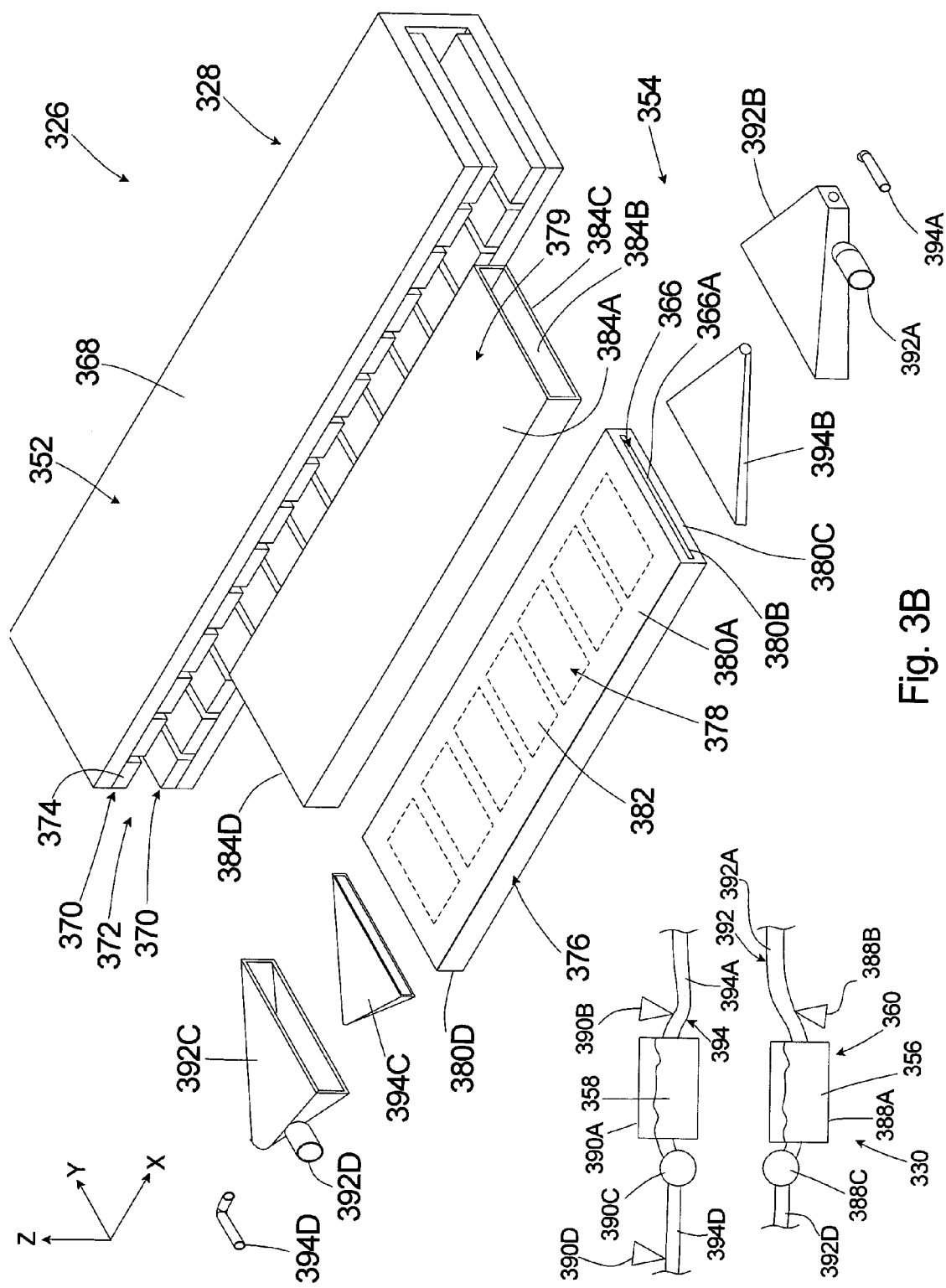
FIG. 3B is an exploded perspective view of the mover combination of FIG. 3A.

FIG. 3B illustrates an exploded perspective view of the mover combination 326 of FIG. 3A. As an overview, in this embodiment, the mover 328 includes (i) a first passageway 364 (illustrated in FIG. 3D) having a first inlet 364A and a first outlet 364B, and (ii) a second passageway 366 having a second inlet 366A and a second outlet 366B (illustrated in FIG. 3D). The location of the passageways 364, 366 can be varied. In this embodiment, both passageways 364, 366 are located in the conductor component 354.

In this embodiment, the magnet component 352 includes a yoke 368 and one or more spaced apart magnet arrays 370. In FIG. 3B, the yoke 368 is somewhat rectangular "C" shaped and includes a generally rectangular shaped top wall, a generally rectangular shaped bottom wall and a generally rectangular rear wall that maintains the top wall spaced apart from and substantially parallel with the bottom wall. In one embodiment, the yoke 368 is made of a magnetically permeable material, such as iron. The magnetically permeable material provides some shielding of the magnetic fields generated by the magnet array(s) 370, as well as providing a low reluctance magnetic flux return path for the magnetic fields of the magnet array(s) 370.

The number and design of magnet arrays 370 can be varied. For example, in FIG. 3B, the magnet component 352 includes two spaced apart magnet arrays 370 that are spaced apart by a magnet gap 372. One of the magnet arrays 370 is secured to the top wall and the other magnet array 370 is secured to the bottom wall. Alternatively, for example, the motor could be designed with a single magnet array 370.

Each of the magnet arrays 370 includes one or more magnets 374. The positioning and the number of magnets 374 in each magnet array 370 can be varied. For example, in FIG. 3B, each magnet array 370 includes a plurality of rectangular shaped magnets 374 that are aligned side-by-side. The magnets 374 in each magnet array 370 are orientated so that the poles alternate between the North pole and the South pole. Stated another way, the magnets 374 in each magnet array 370 are arranged with alternating magnetic polarities. Further, the polarities of opposed magnets in the two magnet arrays 370 are opposite. This leads to strong magnetic fields in the magnet gap 372 and strong force generation of the mover 328. In one embodiment, each of the magnets 374 is made of a high energy product, rare earth, permanent magnetic material such as NdFeB. Alternatively, for example, each magnet 374 can be made of a low energy product, ceramic magnet or other type of material that generates a magnetic field.

The conductor component 354 moves along the X axis in the magnet gap 372 between the magnet arrays 370. The conductor component 354 includes a coil assembly 376 that contains one or more conductor arrays 378 (illustrated in phantom in FIG. 3B), and a circulation housing 379. In FIG. 3B, the coil assembly 376 is somewhat rectangular tube shaped and includes an outer perimeter 380A, an inner perimeter 380B, a first end 380C, and an opposed second end 380D.

In FIG. 3B, the conductor component 354 includes two conductor arrays 378 each having one or more spaced apart coils (conductors) 382 (illustrated in phantom). In one embodiment, each coil 382 is generally rectangular shaped. Each conductor 382 is made of metal such as copper or any substance or material responsive to electrical current and capable of creating a magnetic field. The conductors 382 can be made of wire encapsulated in an epoxy that defines the coil assembly 376. A gap between the two conductor arrays defines the inner perimeter 380B.

Alternatively, for example, the conductor component 354 could include a pair of spaced apart conductor arrays that are positioned on opposite sides of a single magnet array.

In this embodiment, the circulation housing 379 cooperates with the coil assembly 376 to define at least one of the passageways 364, 366. In FIG. 3B, the circulation housing 379 is generally rectangular tube shaped, encircles the coil assembly 376, is generally the same length as the coil assembly 376, and includes (i) an outer perimeter 384A, (ii) an inner perimeter 384B, (iii) a first end 384C and (iv) an opposed second end 384D. In this embodiment, the circulation housing 379 cooperates with the coil assembly 376 to define the first passageway 366. Stated another way, the space between the inner perimeter 384B of the circulation housing 379 and the outer perimeter 380A of the coil assembly 376 defines the first passageway 364. Further, the second passageway 364 is defined by the opening in the coil assembly 376. Alternatively, for example, the circulation housing 379 can include a tubular shaped internal liner (not shown in this figure) that also encloses the outer perimeter 380A of the coil assembly 376, so that both passageways 364, 366 are outside the coil assembly 376.

In one embodiment, the circulation housing 379 is made from a non-electrically conductive, non-magnetic material, such as low electrical conductivity stainless steel or titanium, or non-electrically conductive plastic or ceramic or carbon fiber composite.

The conductor component 354 can include one or more spaced apart, supports (not shown) that support the circulation housing 379 spaced apart from the coil assembly 376. The supports can help to define the first passageway 364. In one embodiment, the supports are not thermally connected to the coil assembly 376 to reduce heat transfer between the conductor housing 376 and the circulation housing 379.

The control system 24 (illustrated in FIG. 1) is connected to the mover 28 (stage mover assembly 204) and directs and controls electrical current to the conductors 382. The electrical current in the conductors 382 interacts with the magnetic fields that surround the magnets 374 in the magnet arrays 370. When electric current flows in the conductors 382, a Lorentz type force is generated in a direction mutually perpendicular to the direction of the wires of the conductors 382 and the magnetic field of the magnets 374. This force can be used to move one of the components 352, 354 relative to the other component 354, 352.

The design of the circulation system 330 can vary. In FIG. 3B, the circulation system 330 directs the first fluid 356 through the first passageway 364 around the outer perimeter 380A of the coil assembly 376 and the second fluid 358 through the second passageway 366 within the coil assembly 376. With this design, in one embodiment, the circulation system 330 can be used to inhibit the transfer of heat from the conductor component 354 and the mover 328.

As outlined above, the circulation system 330 includes the fluid source 360 that directs the first fluid 356 through the first passageway 364 and the second fluid 358 through the second passageway 366. The design of the fluid source 360 can vary. In one embodiment, the fluid source 360 includes a first reservoir 388A that retains the first fluid 356, a first fluid pump 388B in fluid communication with the first reservoir 388A, a first temperature adjuster 388C in fluid communication with the first reservoir 388A, a second reservoir 390A that retains the second fluid 358, a second fluid pump 390B in fluid communication with the second reservoir 390A, and a second temperature adjuster 390C in fluid communication with the second reservoir 390A.

The first fluid pump 388B controls the flow rate and pressure of the first fluid 356 that is directed to the mover 328. The first temperature adjuster 388C adjusts and controls the temperature of the first fluid 356 that is directed to the mover 328. The first temperature adjuster 388C can be a heat exchanger, such as a chiller unit, a heater, or a thermoelectric heat exchanger. The second fluid pump 390B controls the flow rate and pressure of the second fluid 358 that is directed to the mover 328. The second temperature adjuster 390C adjusts and controls the temperature of the second fluid 358 that is directed to the mover 328. The second temperature adjuster 390C can be a heat exchanger, such as a chiller unit, a heater, or a thermoelectric heat exchanger.

In one embodiment, the temperature, flow rate, and type of the first fluid 356 is selected and controlled and the temperature, flow rate, and type of the second fluid 358 is selected and controlled to precisely control the temperature of the outer surface 384A of the circulation housing 379, the conductor component 354 and/or the mover 328. In one embodiment, one or both of the fluids 356, 358 can be Flourinert type FC-77, made by 3M Company in Minneapolis, Minn. and/or R123, made by DuPont, located in Wilmington, Del. The composition of the first fluid 356 can be the same or different than the composition of the second fluid 358.

In one embodiment, the flow rates and temperatures of the fluids 356, 358 are controlled to maintain the outer surface 384A of the conductor component 354 at a predetermined temperature. By controlling the temperature of the outer surface 384A of the conductor component 354, the amount of heat transferred from the mover 328 to the surrounding environment can be controlled and optimized.

In one embodiment, the temperature of the first fluid 356 directed to the first inlet 364A is different than the temperature of the second fluid 358 directed to the second inlet 366A. For example, in one embodiment, (i) the temperature of the first fluid 356 directed to the first inlet 364A is within approximately 5, 4, 3, 2,1, 0.8, 0.6, 0.5, 0.4, 0.3, 0.2, or 0.1 degrees Celsius of the room temperature, and (ii) the temperature of the second fluid 358 directed to the second inlet 366A is within approximately 5, 4, 3, 2, 1, 0.8, 0.6, 0.5, 0.4, 0.3, 0.2, or 0.1 degrees Celsius of the boiling temperature of the second fluid 358 at the absolute pressure within the second passageway 366. For example, (i) the room temperature can be between approximately 20 and 25 degrees Celsius, and (i) the boiling temperature of the second fluid 358 at the absolute pressure within the second passageway 366 can be between approximately 20 and 25 degrees Celsius. In alternative embodiments, the boiling temperature of the second fluid 358 at the absolute pressure within the second passageway 366 can be within approximately 5, 4, 3, 2,1, 0.8, 0.6, 0.5, 0.4, 0.3, 0.2, or 0.1 degrees Celsius of the room temperature.

In one embodiment, the second fluid 358 entering the second inlet 366A is not quite boiling and the second fluid 358 exiting from the second outlet 366B is at approximately boiling. For example, the temperature of the second fluid 358 directed to the second inlet 366A is within at least approximately 2, 1, 0.8, 0.6, 0.5, 0.4, 0.3, 0.2, or 0.1 degrees Celsius below the boiling temperature of the second fluid 358 at the absolute pressure within the second passageway 366 and the temperature of the second fluid 358 exiting from the second outlet 366B is at least approximately 2, 1, 0.8, 0.6, 0.5, 0.4, 0.3, 0.2, 0.1, or 0 degrees Celsius above the boiling temperature of the second fluid 358 at the absolute pressure within the second passageway 366.

The amount of the second fluid 358 exiting from the second outlet 366B that is boiling can vary. In one embodiment, the amount of the second fluid 358 exiting from the second outlet 366B that is boiling is relatively small. For example, in alternative embodiments, the amount of the second fluid 358 exiting from the second outlet 366B that is boiling is less than approximately 10, 5, 4, 3, 2, 1, or 0.5 percent of the total of the second fluid 358 exiting from the second outlet 366B.

The flow rates of the fluids 356, 358 can be varied. For example, the flow rates of the fluids 356, 358 can be controlled to be different. In one embodiment, for example, the flow rate of second fluid 358 is between approximately 2-3 liters per minute and the flow rate of first fluid 356 is approximately 1 liter per minute.

In one embodiment, if the boiling temperature of the second fluid 358 is higher than room temperature, a partial vacuum is created in the second passageway 366 to lower the absolute pressure in the second passageway 366 and the boiling temperature of the second fluid 358. The amount of the partial vacuum can depend upon the type of second fluid 358 and the room temperature. In alternative embodiments, a partial vacuum is created so that the absolute pressure in the second passageway 366 is approximately 0.9 atm (13 PSI), 0.8 atm (12 PSI), or 0.7 atm (10 PSI).

The partial vacuum in the second passageway 366 can be created a number of ways. For example, a vacuum pump 390D can be connected to the second outlet 366B to create the partial vacuum in the second passageway 366.

With some of these designs, the second fluid 358 transfers the bulk of the heat from the conductor component 354 and the first fluid 356 insulates the circulation housing 379 from the heat of the conductors 382, and maintains the temperature of the outer perimeter 384A of the conductor component 354. For example, the heat from the conductors 382 causes the second fluid 358 to boil and then carry the heat away as latent heat and the first fluid 356 can maintain the temperature of the conductor component 354.

In one embodiment, the fluid source 360 includes (i) a first conduit 392 that connects the first fluid pump 388B and the first temperature adjuster 388C in fluid communication with the first passageway 364, and (ii) a second conduit 394 that connects the second fluid pump 390B and the second temperature adjuster 390C in fluid communication with the second passageway 366. The location, design and organization of these components can be varied.

The design of the conduits 392, 394 can be varied. In FIG. 3B, the first conduit 392 includes a first inlet tube 392A, a first inlet plenum 392B, a first outlet plenum 392C, and a first outlet tube 392D. The first inlet tube 392A connects the first pump 388B in fluid communication with the first inlet plenum 392B, the first inlet plenum 392B connects the first inlet tube 392A in fluid communication with the first inlet 364A, the first outlet plenum 392C connects the first outlet 364B in fluid communication with the first outlet tube 392D, and the first outlet tube 392D connects the first outlet plenum 392C in fluid communication with the first temperature adjuster 388C.

Somewhat similarly, In FIG. 3B, the second conduit 394 includes a second inlet tube 394A, a second inlet plenum 394B, a second outlet plenum 394C, and a second outlet tube 394D. The second inlet tube 394A connects the second pump 390B in fluid communication with the second inlet plenum 394B, the second inlet plenum 394B connects the second inlet tube 394A in fluid communication with the second inlet 366A, the second outlet plenum 394C connects the second outlet 366B in fluid communication with the second outlet tube 394D, and the second outlet tube 394D connects the second outlet plenum 394C in fluid communication with the second temperature adjuster 390C.

Figure 3C:
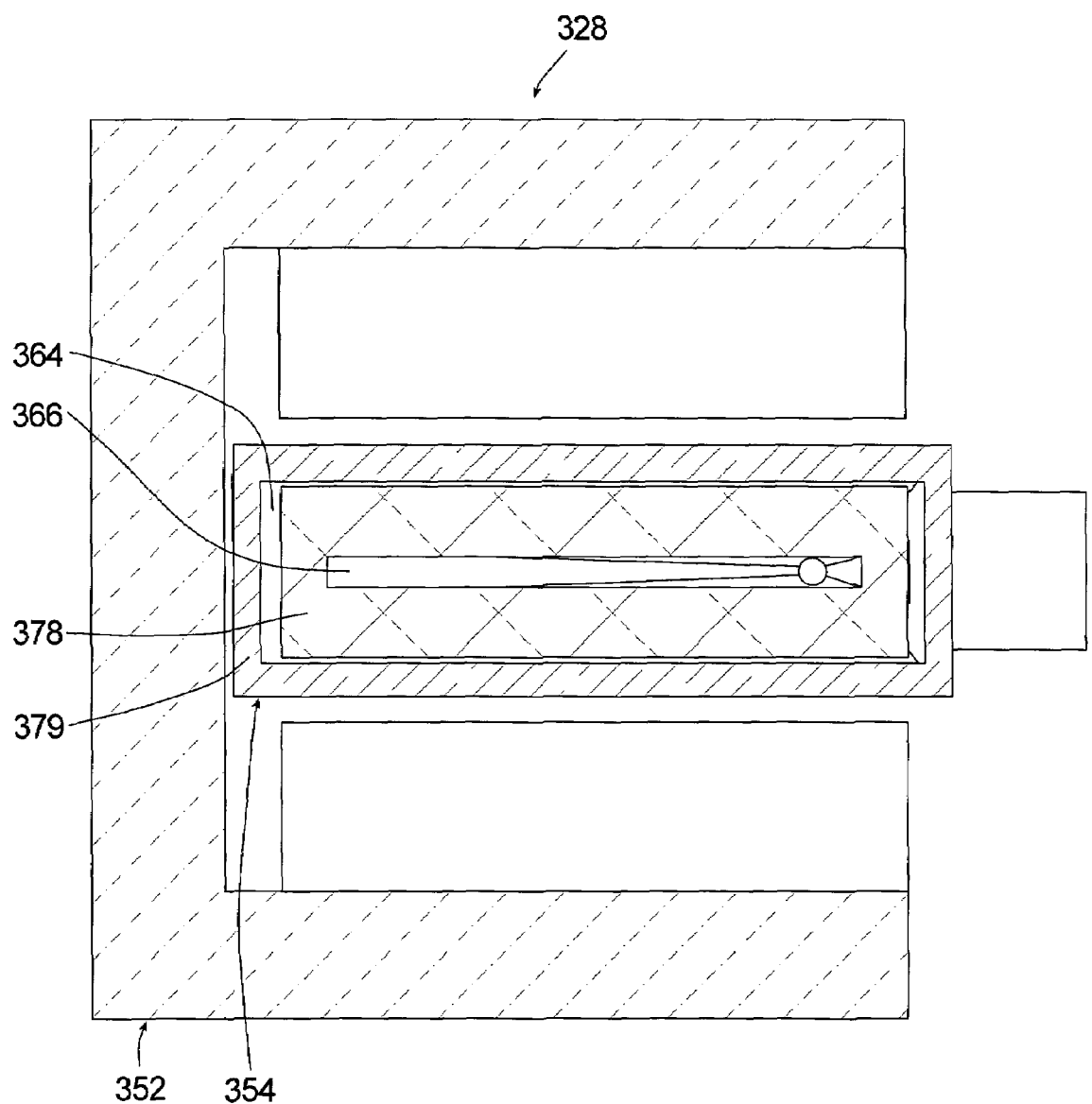
FIG. 3C is cutaway view taken on line 3C-3C in FIG. 3A.

FIG. 3C is cross-sectional view of the mover 328 including the magnet component 352 and the conductor component 354 taken on line 3C-3C in FIG. 3A. FIG. 3C illustrates that (i) the first passageway 364 completely encircles the conductor array 378 and the second passageway 366, (ii) the conductor array 378 completely encircles the second passageway 366, and (iii) the passageways 364, 366 are substantially coaxial. Stated another way, in this embodiment, the first passageway 364 encircles approximately 100 percent of the second passageway 366. In alternative examples, the first passageway 364 could be designed to encircle at least approximately 5, 10, 15, 25, 50, 90, or 95 percent of the circumference of second passageway 366. Stated another way, in alternative examples, the first fluid 356 encircles at least approximately 5, 10, 15, 25, 50, 90, or 100 percent of circumference of the second passageway 366. With design, the first fluid 356 in the first passageway 364 insulates a relatively large portion of the conductor array 378.

The size of each of the passageways 364, 366 can vary. For example, the first passageway 364 can be defined by a gap of between approximately 0.5 to 2 mm between the circulation housing 379 and the conductor array 378. Further, the second passageway 366 is rectangular shaped opening in the conductor array 378 having a width of approximately 80% or more of the width of conductor array 378 and a height of approximately 1 to 5 mm.

Figure 3D:
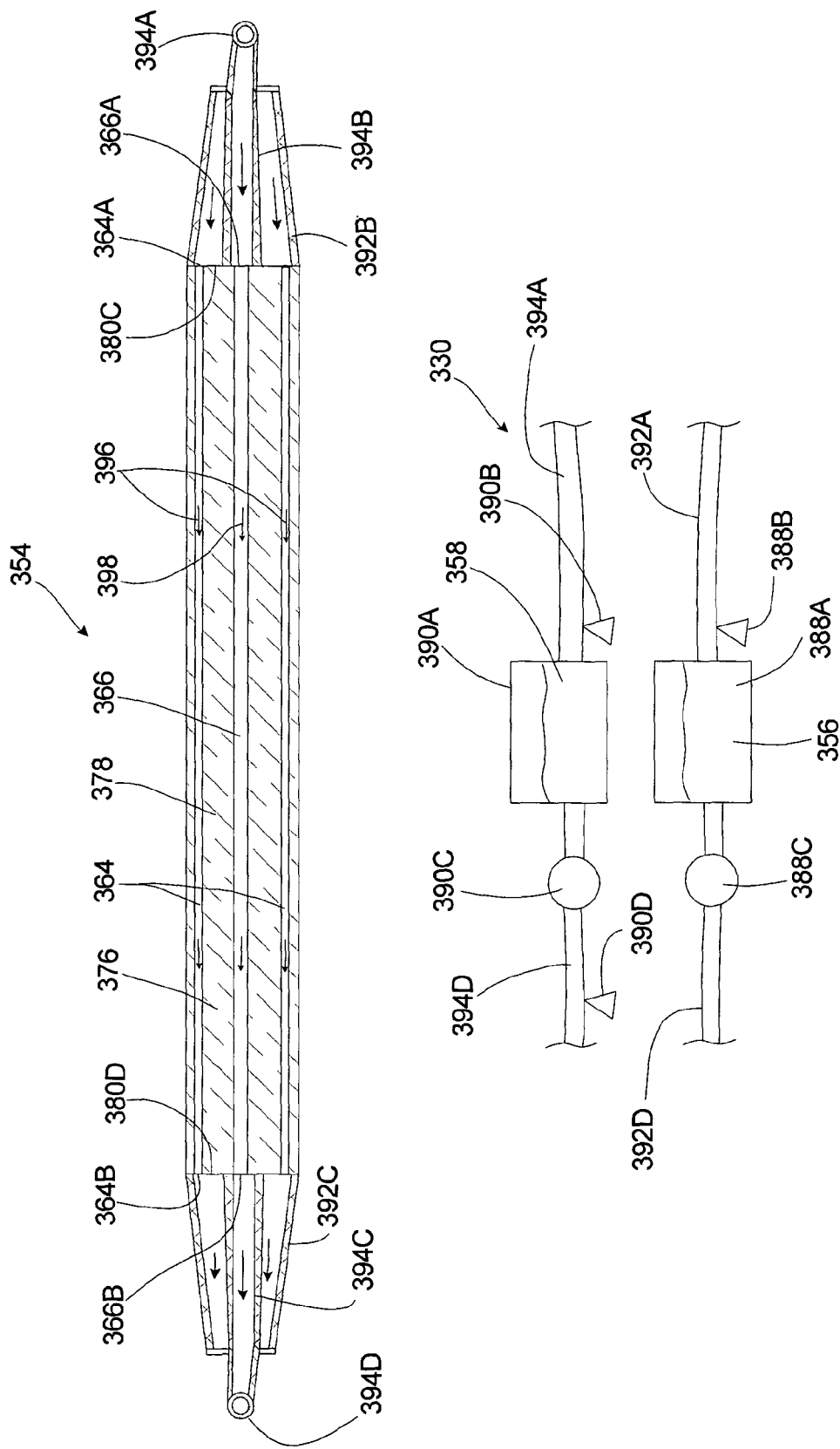
FIG. 3D is a cut-away view of a conductor component and a circulation system of FIG. 3A.

FIG. 3D is a cross-sectional view of the conductor component 354 of FIG. 3A and the circulation system 330. FIG. 3D illustrates the first inlet 364A, the first outlet 364B, the second inlet 366A and the second outlet 366B. In this embodiment, (i) the first passageway 364 encircles the conductor array 378 and the second passageway 366, (ii) the conductor array 378 encircles the second passageway 366, (iii) the passageways 364, 366 are substantially coaxial and concentric, (iv) the first inlet plenum 392B encircles the second inlet plenum 394B, and (v) the first outlet plenum 392C encircles the second outlet plenum 394C.

In FIG. 3D, the first fluid 356 is retained in the first reservoir 388A. Subsequently, the first fluid pump 388B draws the first fluid 356 from the first reservoir 388A and directs the first fluid 356 sequentially through the first inlet tube 392A, the first inlet plenum 392B, the first passageway 364, the first outlet plenum 392C, the first outlet tube 392D, the first temperature adjuster 388C and back to the first reservoir 388A. Somewhat similarly, the second fluid pump 390B draws the second fluid 358 from the second reservoir 390A, and directs the second fluid 358 sequentially through the second inlet tube 394A, the second inlet plenum 394B, the second passageway 366, the second outlet plenum 394C, the second outlet tube 394D, the vacuum pump 390D, the second temperature adjuster 390C and back to the second reservoir 390A. Arrows designated 396 illustrate the flow of the first fluid 356 through the conductor component 354 and arrows designated 398 illustrate the flow of the second fluid 358 through the conductor component 354.

In should be noted that the location of the inlets 364A, 366A and the outlets 364B, 366B can be varied to influence the cooling of the conductor component 354. In the embodiment illustrated in FIG. 3D, first inlet 364A and the second inlet 366A are located near the first end 380C of the coil assembly 376 and the outlets 364B, 366B are located near the second end 380D of the conductor housing 376. Alternatively, one or both of the inlets 364A, 366A can be located near the second end of the coil assembly 376 or intermediate the ends 380C, 380D, and/or one or both of the outlets 364B, 366B can be located near the first end 380C of the conductor housing 376 or intermediate the ends 380C, 380D. For example, the first fluid 356 and the second fluid 358 can be arranged to flow in opposite directions, orthogonal to each other, or at another angle relative to each other. Alternatively, for example, the single inlets 364A, 366A and the single outlets 364B, 366B, illustrated in FIG. 3D, can be replaced by multiple inlets and/or multiple outlets.

Figure 3E:
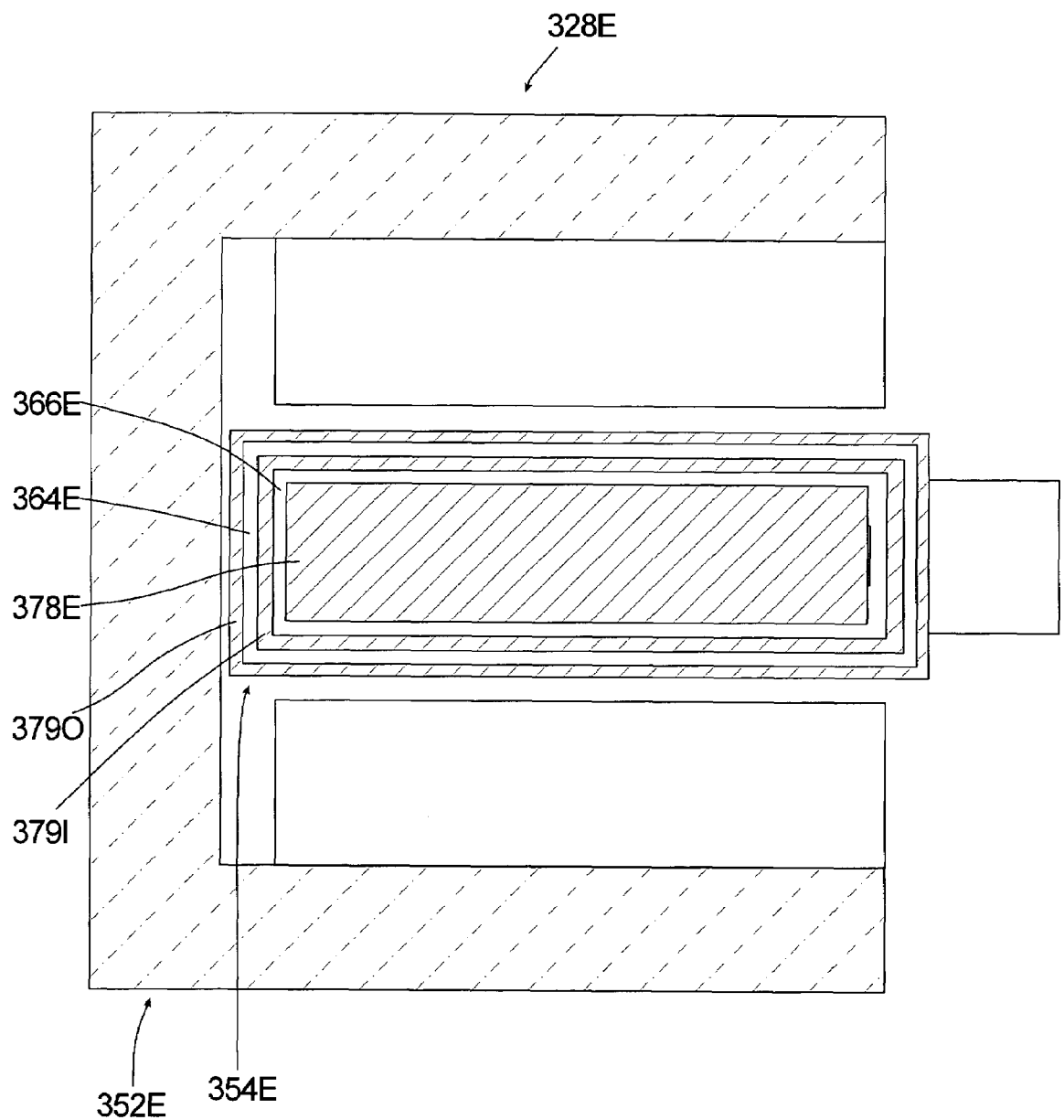
FIG. 3E is a cut-away view of another embodiment of a conductor component having features of the present invention.

FIG. 3E is cross-sectional view of another embodiment of a mover 328E including the magnet component 352E and the conductor component 354E that is somewhat similar to the mover 328 illustrated in FIG. 3C. However, in this embodiment, (i) the first passageway 364E completely encircles the second passageway 366E and the conductor array 378E and, (ii) the second passageway 366E completely encircles the conductor array 378E. In this embodiment, the first passageway 364E is defined by a gap of between approximately 0.5 to 2 mm between an outer circulation housing 379O and an inner circulation housing 379I. Further, the second passageway 366 is defined by a gap of between approximately 0.5 to 2 mm between the inner circulation housing 379I and the conductor array 378E.

Figure 3F:
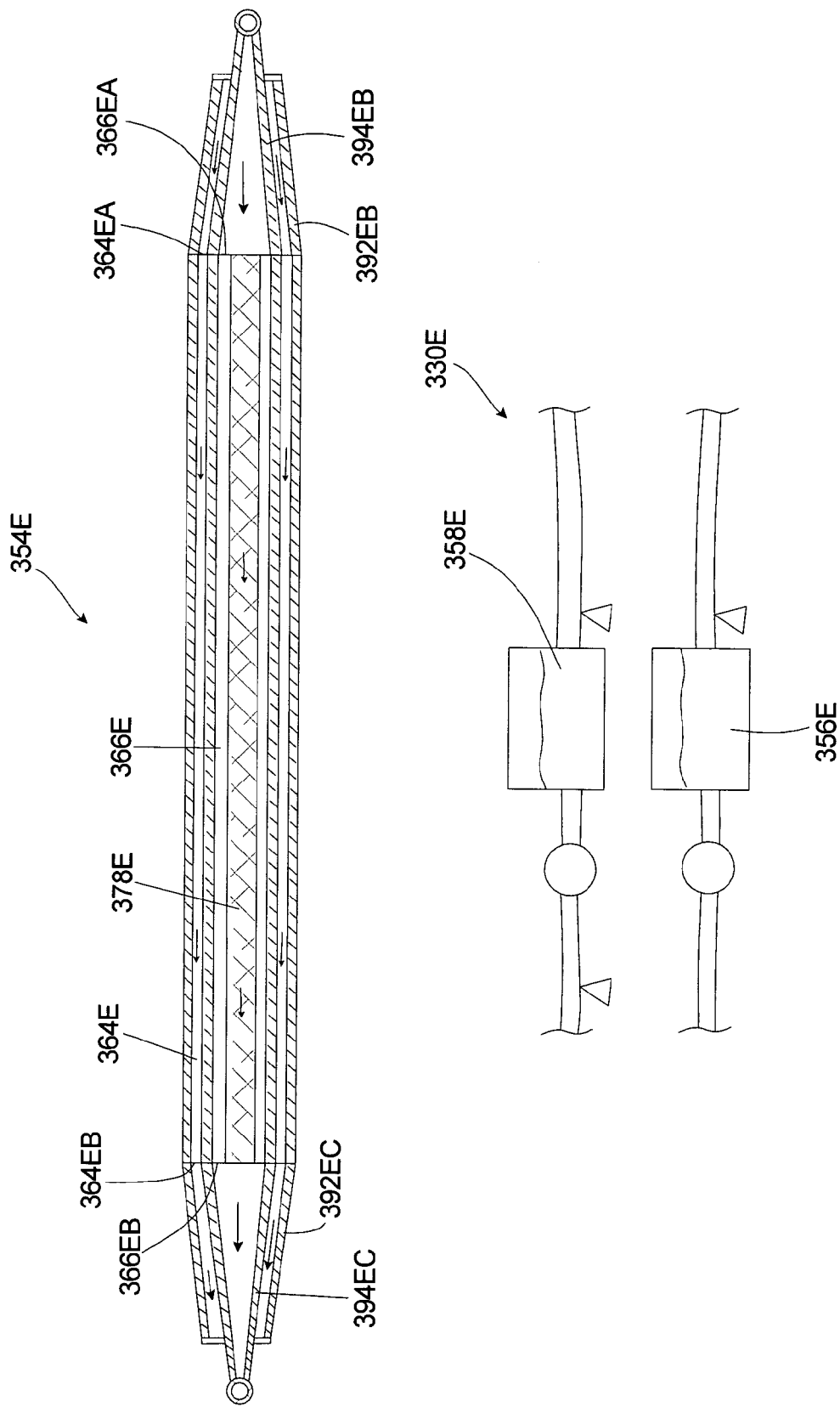
FIG. 3F is an alternative cut-away view of the conductor component of FIG. 3E and a circulation system having features of the present invention.

FIG. 3F is a cross-sectional view of the conductor component 354E of FIG. 3E and a circulation system 330E that is similar to the circulation system 330 described above. FIG. 3F illustrates the first inlet 364EA, the first outlet 364EB, the second inlet 366EA and the second outlet 366EB. In this embodiment, (i) the first passageway 364E encircles the second passageway 366E and the conductor array 378E and, (ii) the second passageway 366E encircles the conductor array 378E, (iii) the passageways 364E, 366E are substantially coaxial and concentric, (iv) the first inlet plenum 392EB encircles the second inlet plenum 394EB, and (v) the first outlet plenum 392EC encircles the second outlet plenum 394EC.

In FIG. 3F, the circulation system 330E directs a first fluid 356E through the first passageway 364E and a second fluid 358E through the second passageway 366E.

Figure 4A:
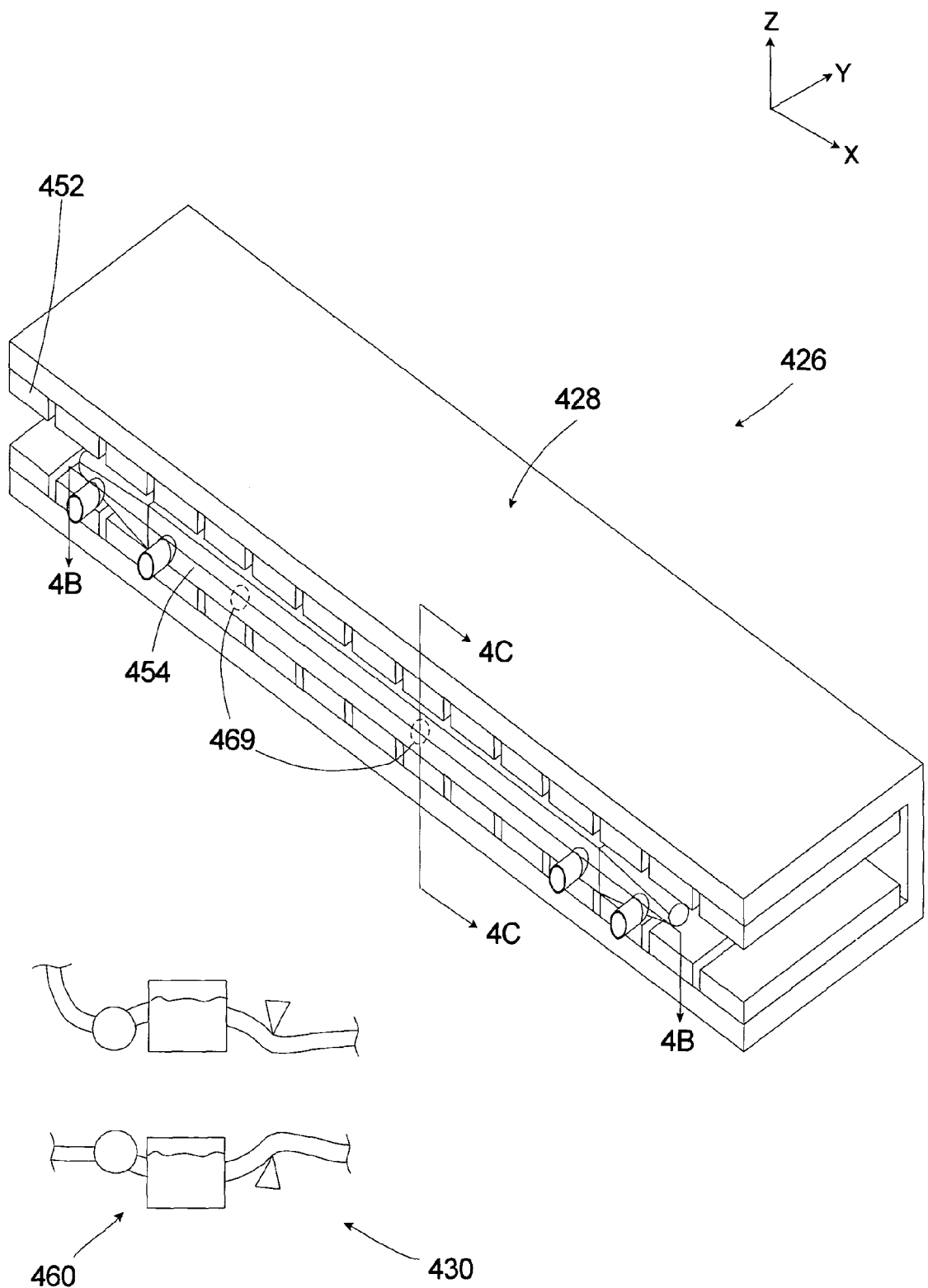
FIG. 4A is a perspective view of an alternate embodiment of a mover combination having features of the present invention.

FIG. 4A is a perspective view of another embodiment of a mover combination 426 including a mover 428 and a circulation system 430 having features of the present invention. In this embodiment, the mover 428 includes a magnet component 452 and a conductor component 454 and the circulation system 430 includes a fluid source 460. In this embodiment, the magnet component 452 is similar to the magnet component 352 described above.

Further, in this embodiment, the conductor component 454 is somewhat similar to the conductor component described above. However, in this embodiment, the conductor component 454 defines a first passageway 464 (illustrated in FIG. 4B) having a first inlet 464A and a first outlet 464B, a sealed second passageway 466 (illustrated in FIG. 4B), and a third passageway 467 (illustrated in FIG. 4B) having a third inlet 467A and a third outlet 467B. Further, the conductor component 454 includes a conductor array 479 (illustrated in FIG. 4B).

Further, the conductor component 454 includes one or more heat transferers 469 (illustrated in phantom) that transfer heat from the conductor array 479. In one embodiment, the heat transferers 469 transfer heat from the conductor array 479 to the third passageway 467. Alternatively, for example, the heat transferers 469 can transfer the heat from the conductor array 479 to another location. For example, the heat transferers 469 can transfer heat from the conductor arrays 479 to the outside of the conductor component 454.

The number and position of the heat transferers 469 can vary. For example, in FIG. 4A, the conductor component 454 includes two spaced apart heat transferers 469. Alternatively, the conductor component 454 can include more than two or less than two heat transferers 469.

FIG. 4B illustrates a cross-sectional view of the conductor component 454 and the circulation system 430. In FIG. 4B, the circulation system 430 delivers a first fluid 456 to the first inlet 464A to circulate the first fluid 456 through the first passageway 464 and a third fluid 459 to the third inlet 467A to circulate the third fluid 459 through the third passageway 467. Arrows 496, 499 illustrate flow of the fluids 456, 459, respectively in the conductor component 454.

In this embodiment, an outer circulation housing 479O and an inner circulation housing 479I cooperate to define the first passageway 464 and the inner circulation housing 479I and the conductor array 478 cooperate to define the second passageway 466.

In one embodiment, the temperature of the first fluid 456 at the first inlet 464A is approximately at room temperature, and the temperature of the third fluid 459 at the third inlet 467A is approximately at room temperature. Alternatively, the temperature of the first fluid 456 at the first inlet 464A and/or the temperature of the third fluid 459 at the third inlet 467A is within approximately 5, 4, 3, 2, 1, 0.8, 0.6, 0.5, 0.4, 0.3, 0.2, or 0.1 degrees Celsius of the room temperature. The second passageway 466 is sealed. In alternative embodiments, the second fluid 458 (illustrated as small triangles) in the second passageway 466 is air, nitrogen, helium, inert gas, or another type chemically non reactive fluid or gas. Alternatively, the second passageway 466 can be maintained at a vacuum.

FIG. 4B also illustrates that the heat transferers 469 extend between the conductor arrays 478 and the third passageway 467.

Figure 4C:
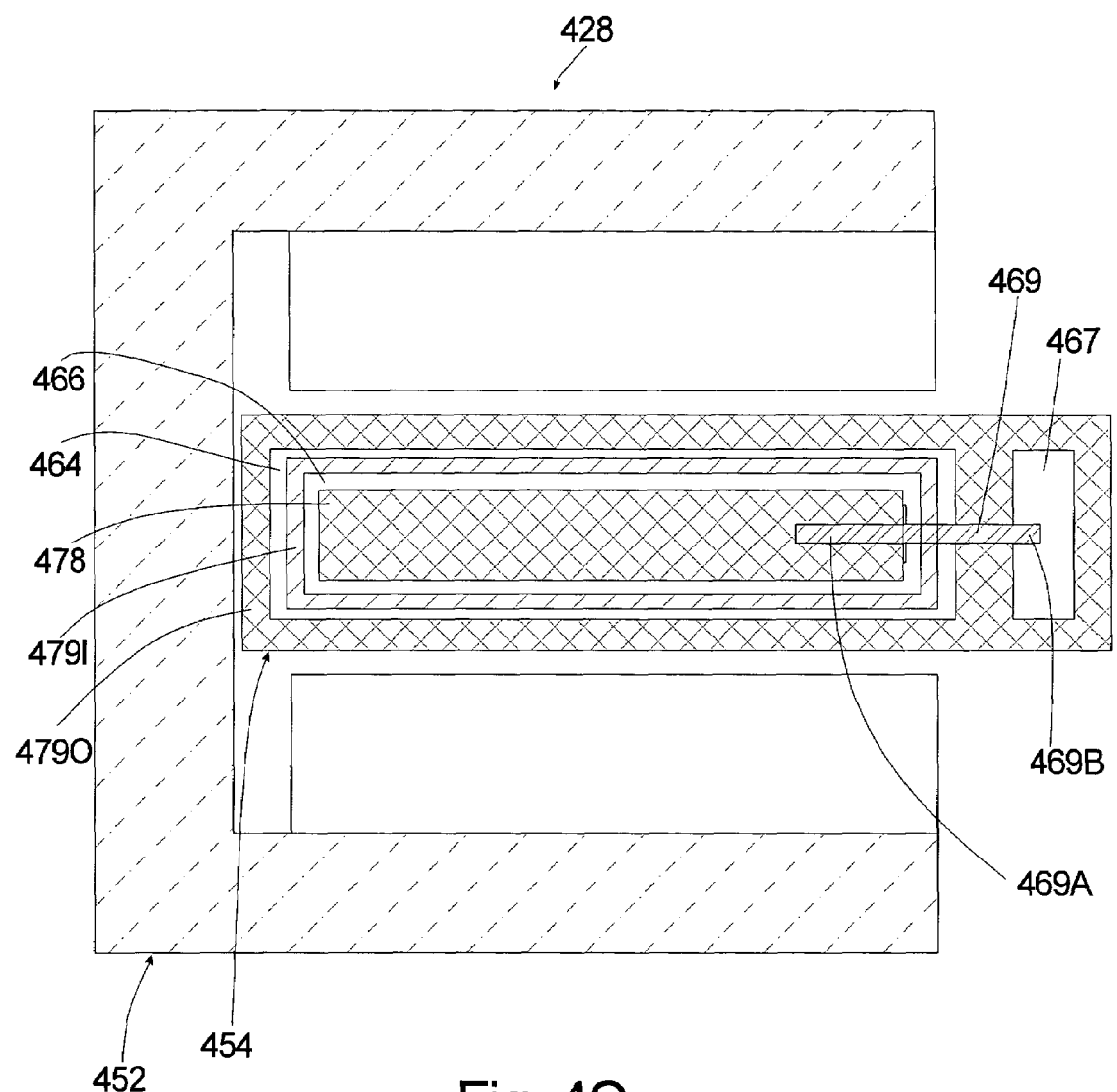
FIG. 4C is a cut-away view taken on line 4C-4C of FIG. 4A.

FIG. 4C is a cross-sectional view of the mover 428 including the magnet component 452 and the conductor component 454 taken on line 4C-4C in FIG. 4A. FIG. 4C illustrates that (i) the first passageway 464 encircles the conductor arrays 478 and the second passageway 466, (ii) the second passageway 466 encircles conductor arrays 478, and (iii) the passageways 464, 466 are substantially coaxial. With design, the first fluid 456 (illustrated in FIG. 4B) in the first passageway 464 insulates a relatively large portion of the conductor array 478. Additionally, the second fluid 466 in the second passageway 466 insulates the conductor array 478 and is between the conductor array 478 and the first fluid 456. Further, FIG. 4C illustrates that the third passageway 467 can be generally rectangular shaped, is defined by an aperture in the outer circulation housing 479O and can extend along one of the sides or edges of the conductor array 478. Alternatively, the third passageway 467 can be in another location. The size of each of the passageways 464, 466, 467 can vary.

The design of the heat transferers 469 can vary. In the embodiment illustrated in FIG. 4C, each heat transferer 469 includes a first end 469A that is positioned within the conductor arrays 479 and a second end 469B positioned within the third passageway 467. With this design, each heat transferer 469 can be used to transfer heat from the conductor array 479 to the third passageway 467. Alternatively, the second end 469B could be exposed or in thermal communication with an external chiller. With this design, each heat transferer 469 would transfer heat from the conductor arrays 479 to the surrounding environment. In one embodiment, one or more of the heat transferers 469 is in direct thermal contact with the conductor arrays 478. In another embodiment, one or more of the heat transferers 469 is substantially not in electrical contact with and is electrically isolated from the conductor arrays 478. Still alternatively, the first end 469A can extend into the second passageway 466.

In one embodiment, at least one of the heat transferers 469 is a heat pipe. In this embodiment, the heat pipe consists of a sealed metal tube containing a liquid and a wick. With this design, the liquid evaporates at the heated first end 469A and the vapor spreads along the tube to the cold second end 469B, where it condenses onto the wick, the liquid flows back along the wick to the hot first end 469A by capillary action. The type of liquid and pressure in the tube can be varied to suit the design requirement of the heat pipe.

In another embodiment, the heat transferers 469 can be a solid beam or structure that is formed from a suitable material that has a relatively high thermal conductivity. For example, in alternative embodiments, the material in the heat transferer 469 can have a thermal conductivity of at least approximately 50 watts per meter degree Kelvin (W/mK), 100 W/mK, 200 W/mK, or 300 W/mK. Examples of materials that satisfy these desired thermal conductivity ranges, along with their approximate thermal conductivity values, include aluminum (237 W/mK), gold (317 W/mK), copper (401 W/mK) and silver (429 W/mK). Alternately, other suitable materials having thermal conductivities in the ranges provided herein can be used.

In one embodiment, the heat transferers 469 remove the majority of the heat generated in the conductor arrays 478 and the first fluid 456 that is circulated in the first passageway 464 maintains the outer surface of the conductor component 454 at the desired temperature.

Figure 5A:
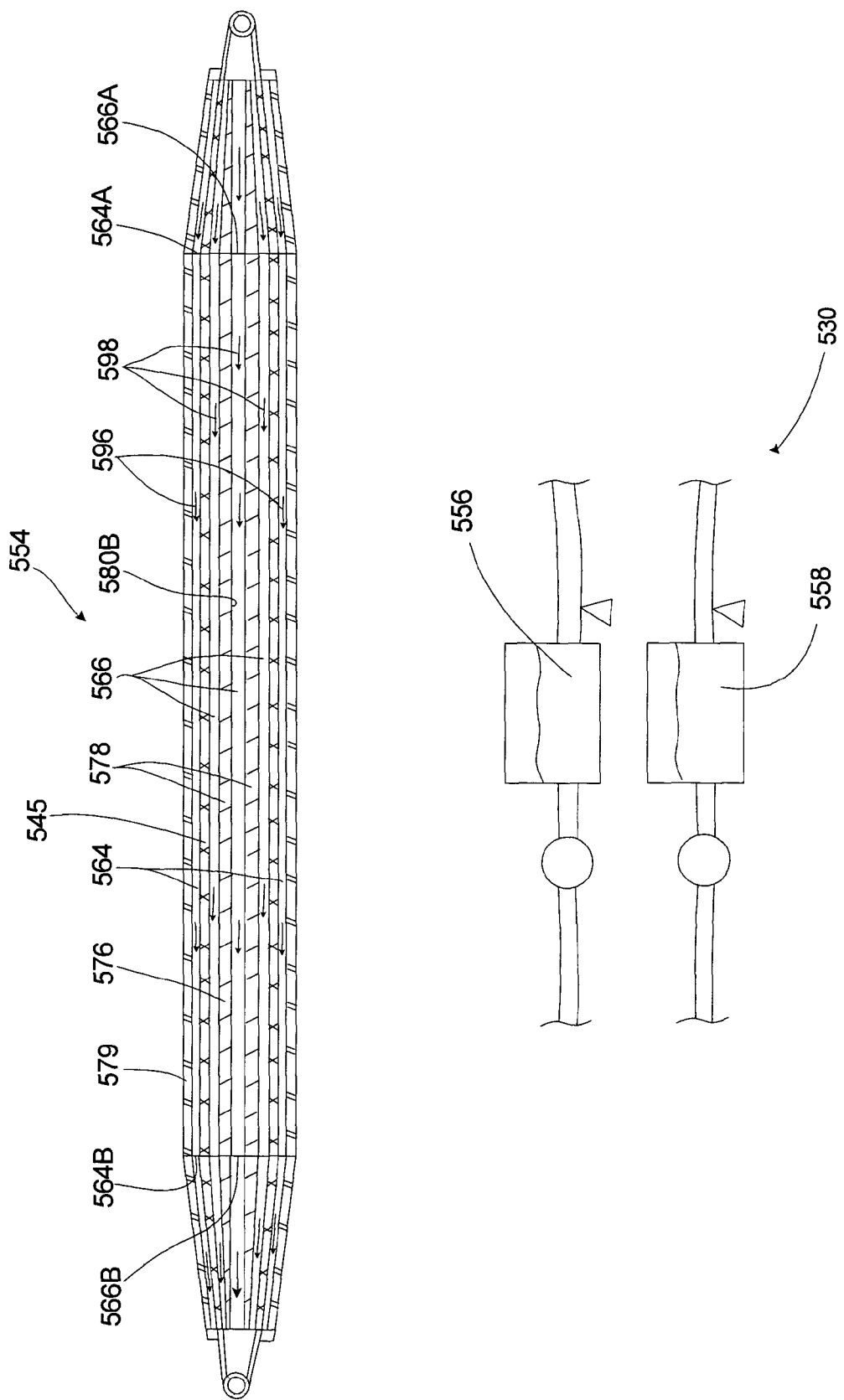
FIG. 5A is a cut-away view of another embodiment of a conductor component and a circulation system.

FIG. 5A is a schematic view of the circulation system 530 and a cross-sectional view of another embodiment of the conductor component 554. In this embodiment, (i) the circulation system 530 is similar to the circulation system 330 described above and illustrated in FIGS. 3A-3D, (ii) the conductor component 554 again defines a first passageway 564 having a first inlet 564A and a first outlet 564B and a second passageway 566 having second inlet 566A and a second outlet 566B, and (iii) the circulation system 530 again delivers a first fluid 556 to the first inlet 564A and a second fluid 558 to the second inlet 566A. However, in this embodiment, the conductor component 554 is slightly different than the conductor component 354 illustrated in FIG. 3D.

More specifically, in this embodiment, the conductor component 554 again includes two conductor arrays 578 and a gap between the two conductor arrays 578 defines the inner perimeter 580B. However, in this embodiment, a liner 545 encircles the conductor arrays 578 and the circulation housing 579 encircles the liner 545 and the coil assembly 576. In this embodiment, the circulation housing 579 cooperates with the liner 545 to define the first passageway 564. Further, the second passageway 566 is defined by the opening in the coil assembly 576 and the space between the coil assembly 576 and the liner 545.

With this design, the first passageway 564 is not defined by the conductor arrays 578 and heat is not directly transferred from the conductor arrays 578 to the first fluid 556.

Arrows 596, 598 illustrate the flow of the fluids 556, 558 respectively in the conductor component 554.

FIG. 5B is a schematic view of the circulation system 530 and a cross-sectional view of yet another embodiment of the conductor component 554. In this embodiment, (i) the circulation system 530 is similar to the circulation system 430 described above and illustrated in FIGS. 4A-4C, (ii) the conductor component 554 defines a first passageway 564 having a first inlet 564A and a first outlet 564B, a sealed second passageway 566, and a third passageway 567 having a third inlet 567A and a third outlet 567B, and (iii) the circulation system 530 delivers a first fluid 556 to the first inlet 564A and a third fluid 559 to the third inlet 567B.

Further, in this embodiment, the conductor component 554 again includes two conductor arrays 578 and a gap between the two conductor arrays 578 defines the inner perimeter 580B. In this embodiment, the liner 545 encircles the conductor arrays 578. In FIG. 5, the circulation housing 579 encircles the liner 545 and the coil assembly 576. In this embodiment, the circulation housing 579 cooperates with the liner 545 to define the first passageway 564. Further, the second passageway 566 is defined by the opening in the coil assembly 576 and the space between the coil assembly 576 and the liner 545.

With this design, the first passageway 564 is not defined by the conductor arrays 578 and heat is not directly transferred from the conductor arrays 578 to the first fluid 556.

Further, the conductor component 554 includes one or more heat transferers 569 that transfer heat from the second passageway 566 to the third passageway 567 somewhat similar to the embodiment described above and illustrated in FIGS. 4B and 4C.

Arrows 596, 599 illustrate the flow of the fluids 596, 599 respectively in the conductor component 554.

Figure 6A:
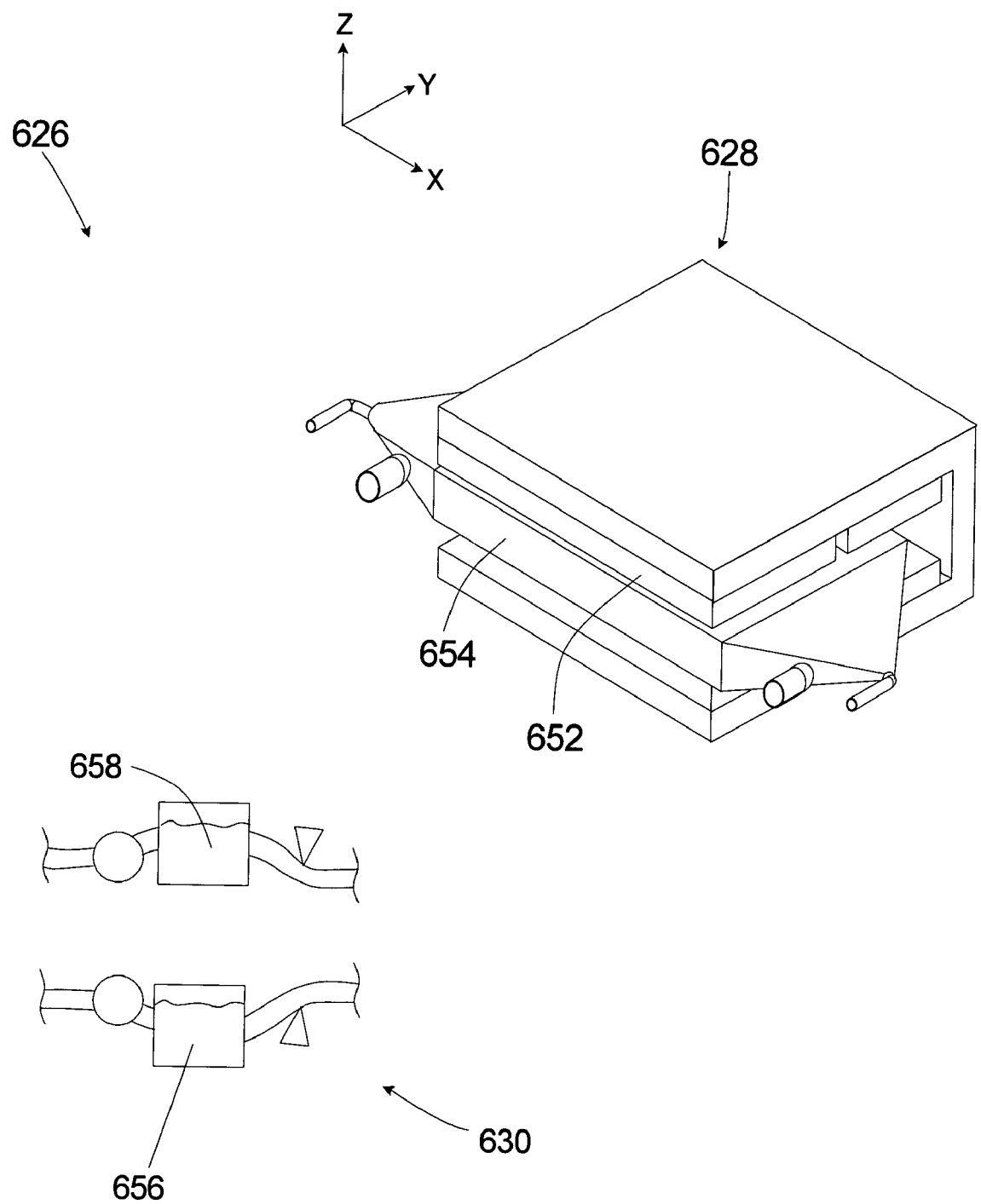
FIG. 6A is a perspective view of another embodiment of a mover combination having features of the present invention.

FIG. 6A is a perspective view of another embodiment of a mover combination 626 including a mover 628 and a circulation system 630 having features of the present invention. In this embodiment, the mover 628 is a voice coil motor and includes a magnet component 652, and a conductor component 654 that interacts with the magnet component 652. A voice coil mover is a short stroke electromagnetic mover in which the current is a function of the required force only and not the relative position between the conductor and the magnet component. In FIG. 6A, the conductor component 654 moves linearly along the Y axis relative to the stationary magnet component 652. Further, the magnet component 652 and the conductor component 654 are shorter than the corresponding components described above. In this embodiment, the circulation system 630 is similar to the circulation system 330 described above and illustrated in FIGS. 3A-3D. In particular, the circulation system 630 directs a first fluid 656 and a second fluid 658 to the mover 628.

Alternatively, for example, the conductor component and circulation system could be somewhat similar to the corresponding components described above and illustrated in FIGS. 4A-4C. In this embodiment, conductor component would include one or more heat transferers.

Figure 6B:
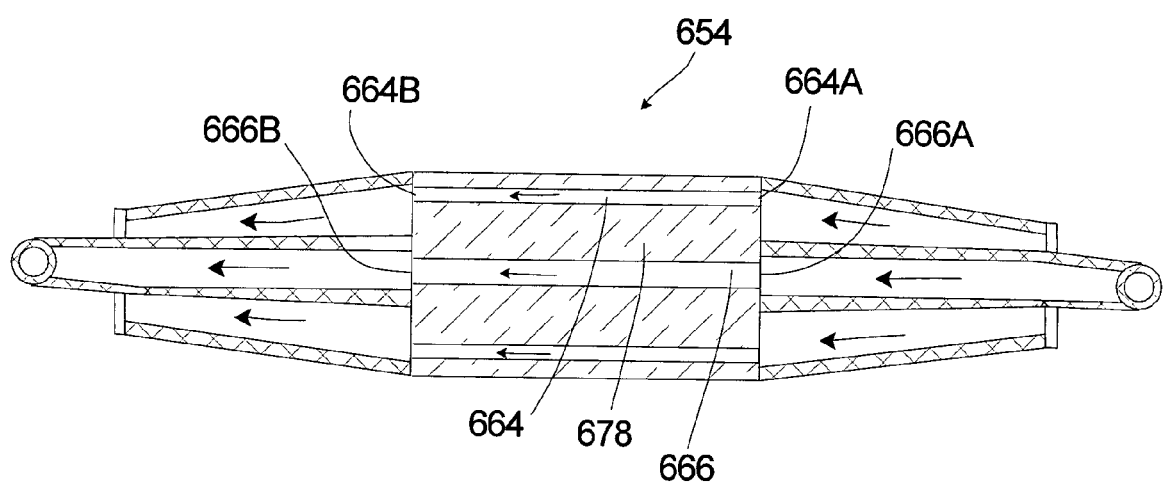
FIG. 6B is a cutaway view of the conductor component of FIG. 6A.

FIG. 6B is a cross-sectional view of the conductor component 654 of FIG. 6A. FIG. 6B illustrates the first inlet 664A, the first outlet 664B, the second inlet 666A and the second outlet 666B. FIG. 6B also illustrates that (i) the first passageway 664 encircles the conductor array 678 and the second passageway 666, (ii) the conductor array 678 encircles the second passageway 666, and (iii) the passageways 664, 666 are substantially coaxial and concentric.

Figure 7A:
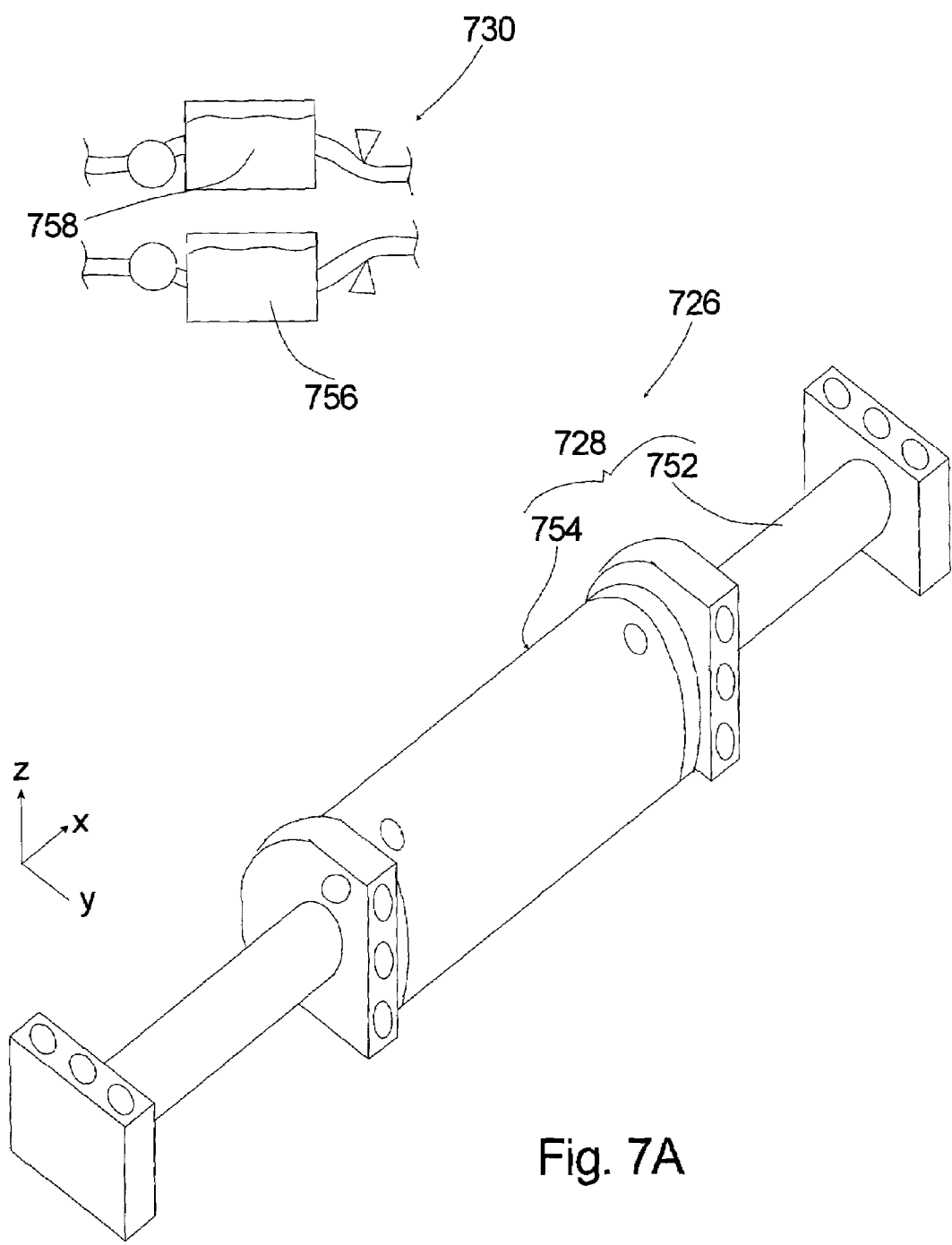
FIG. 7A is a perspective view of still embodiment of a mover combination having features of the present invention.

FIG. 7A is a perspective view of another embodiment of a mover combination 726 including a mover 728 and a circulation system 730 having features of the present invention. In this embodiment, the mover 728 is a shaft type linear motor and includes a magnet component 752, and a conductor component 754 that interacts with the magnet component 752. In FIG. 7A, the conductor component 754 moves linearly along the X axis relative to the stationary magnet component 752. In this embodiment, the magnet component 752 is generally right cylindrical shaped. The circulation system 730 is similar to the circulation system 730 described above and separately directs a first fluid 756 and a second fluid 758 to the mover 728.

Alternatively, for example, the circulation system could be somewhat similar to the corresponding components described above and illustrated in FIGS. 4A and 4B. In this embodiment, conductor component would include one or more heat transferers.

Figure 7B:
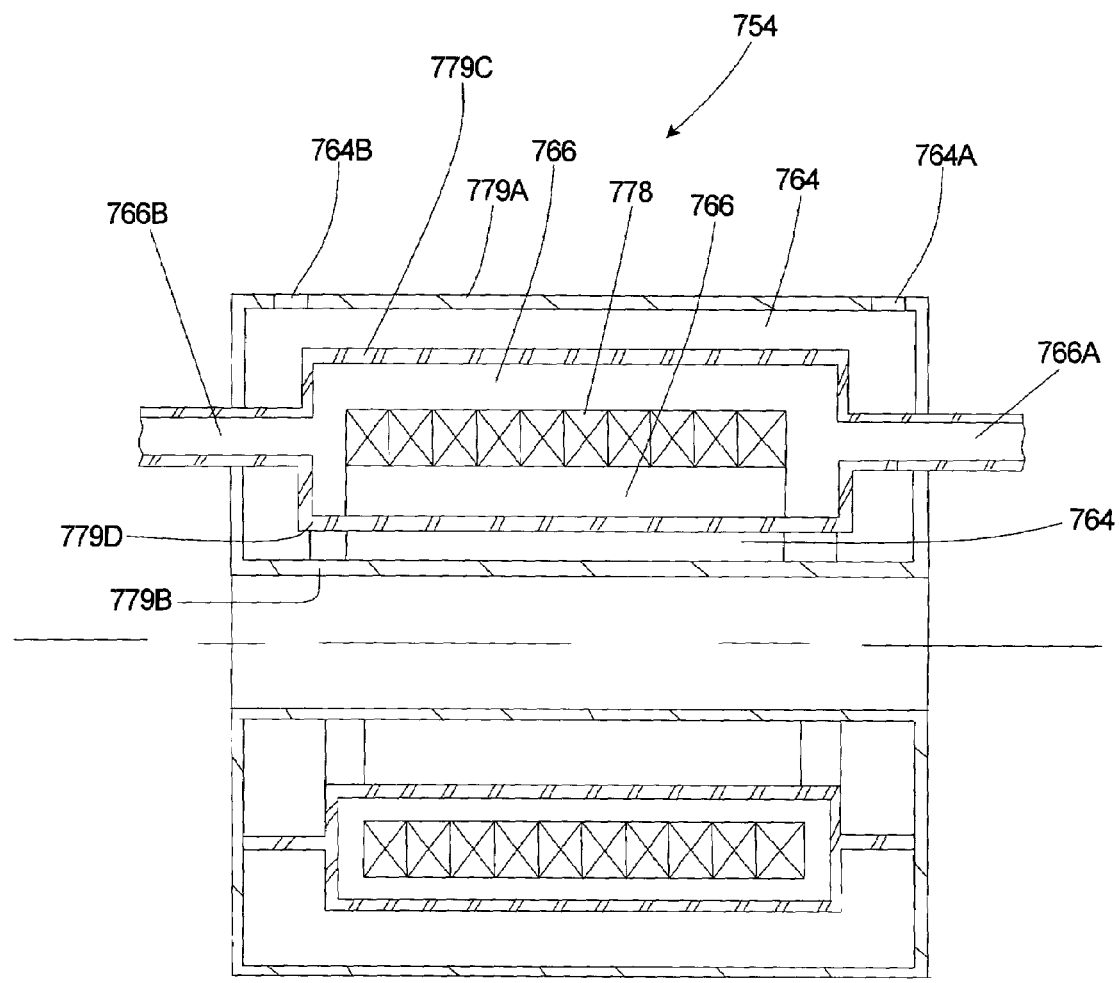
FIG. 7B is a cutaway view of a conductor component of FIG. 7A.

FIG. 7B is a cross-sectional view of the conductor component 754. FIG. 7B illustrates the first inlet 764A, the first outlet 764B, the second inlet 766A and the second outlet 766B. In this embodiment, the conductor component 754 is generally annular shaped and includes a generally annular shaped outer circulation housing 779A, a generally annular shaped conductor array 778 including a plurality of conductors, a generally annular shaped inner circulation housing 779B, a generally annular shaped, first intermediate circulation housing 779C, a generally annular shaped, second intermediate circulation housing 779D. In this embodiment, the outer circulation housing 779A encircles the conductor array 778, the inner circulation housing 779B and the intermediate circulation housings 779C, 779D. In this embodiment, (i) the first passageway 764 is defined by the annular shaped channel between the outer circulation housing 779A and the first intermediate circulation housing 779C and the annular shaped channel between the second intermediate circulation housing 779D and the inner circulation housing 779B, and (ii) the second passageway 766 is defined by the annular shaped channel between the first intermediate circulation housing 779C and the conductor array 778, and the annular shaped channel between the second intermediate circulation housing 779D and the conductor array 778.

In this embodiment, (i) the first passageway 764 encircles the second passageway 766 and the conductor array 778, and (ii) the second passageway 766 encircles the conductor array 778.

Figure 8A:
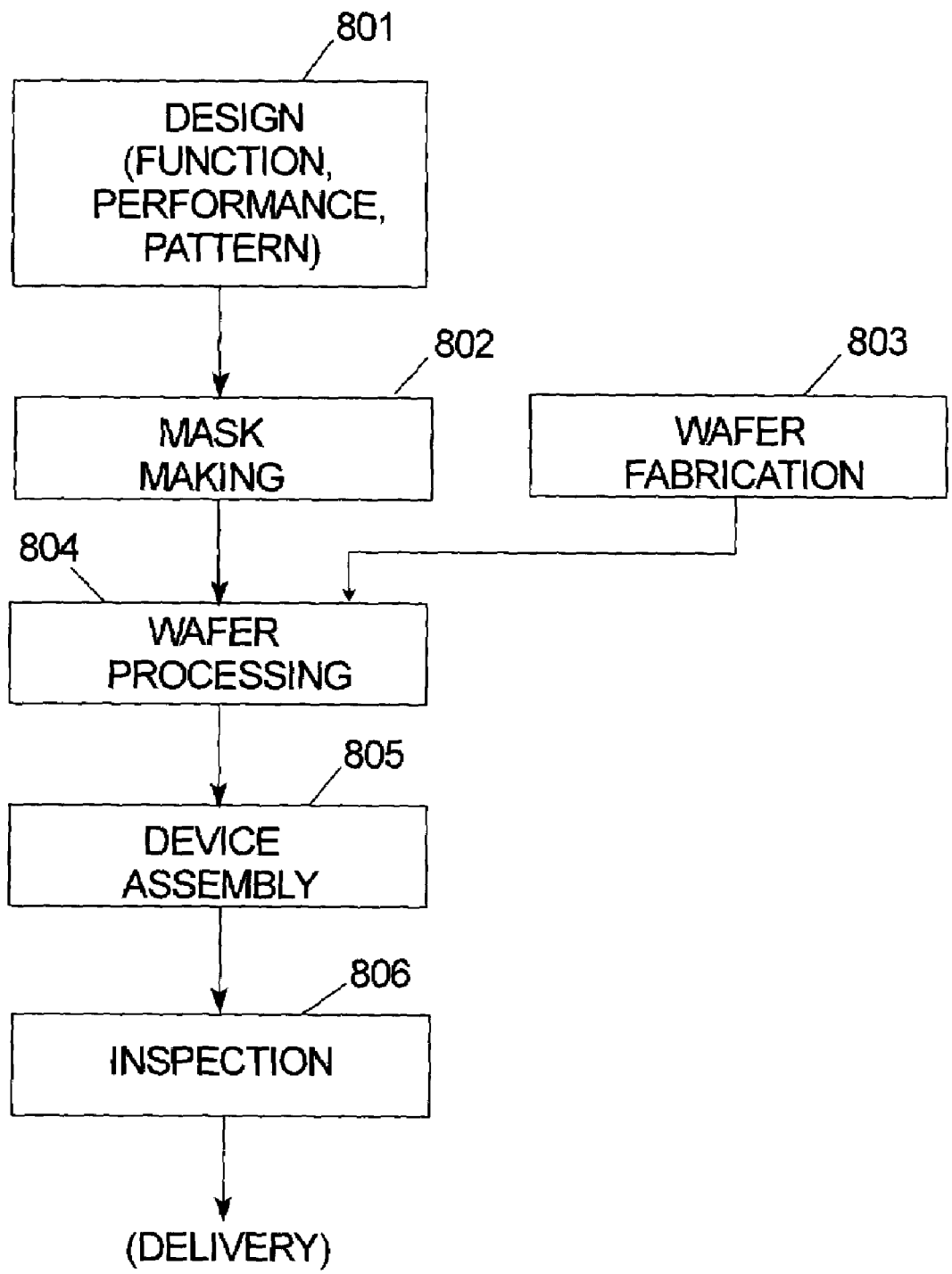
FIG. 8A is a flow chart that outlines a process for manufacturing a device in accordance with the present invention.

Further, semiconductor devices can be fabricated using the above described systems, by the process shown generally in FIG. 8A. In step 801 the device's function and performance characteristics are designed. Next, in step 802, a mask (reticle) having a pattern is designed according to the previous designing step, and in a parallel step 803 a wafer is made from a silicon material. The mask pattern designed in step 802 is exposed onto the wafer from step 803 in step 804 by a photolithography system described hereinabove in accordance with the present invention. In step 805, the semiconductor device is assembled (including the dicing process, bonding process and packaging process), finally, the device is then inspected in step 806.

Figure 8B:
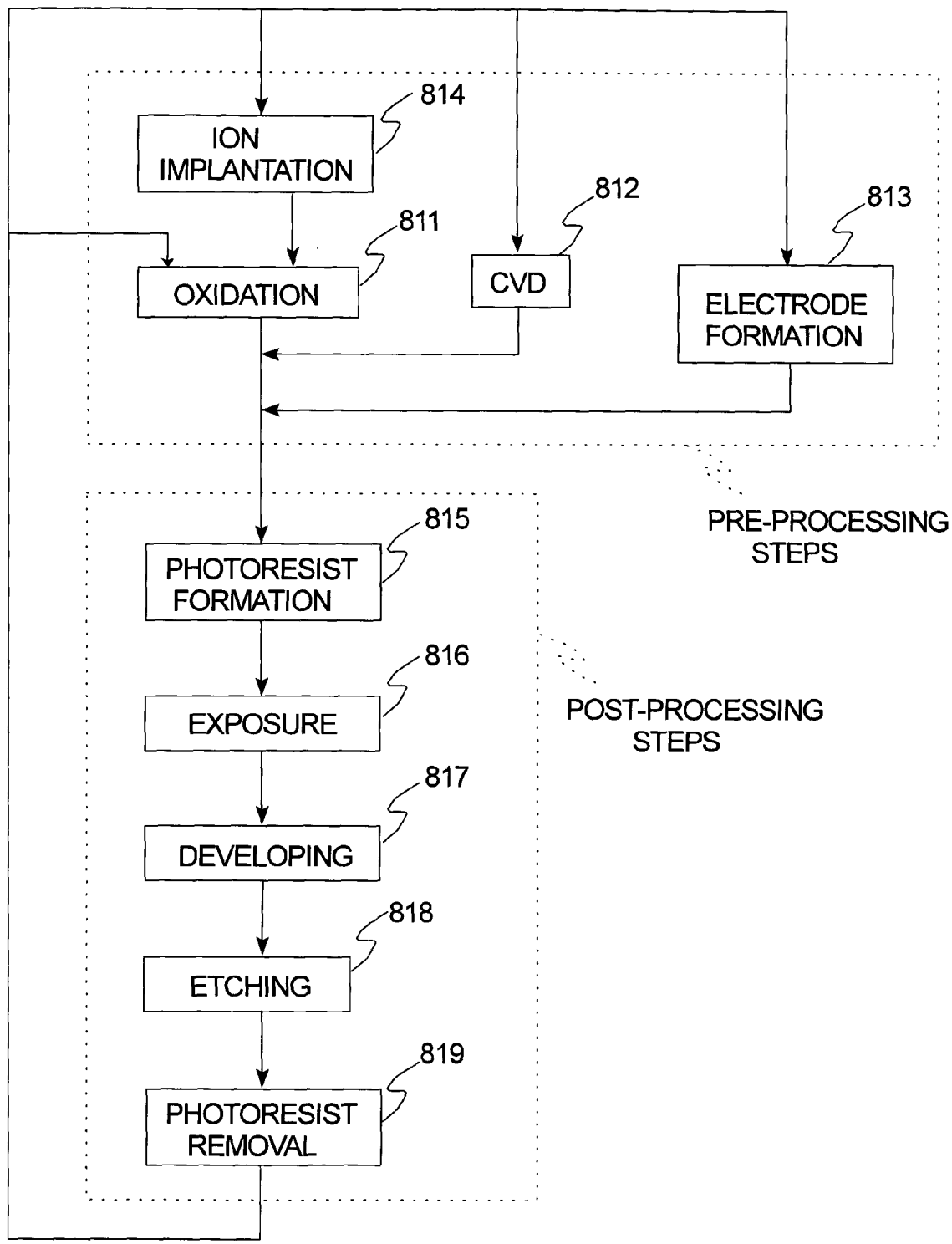
FIG. 8B is a flow chart that outlines device processing in more detail.

FIG. 8B illustrates a detailed flowchart example of the above-mentioned step 804 in the case of fabricating semiconductor devices. In FIG. 8B, in step 811 (oxidation step), the wafer surface is oxidized. In step 812 (CVD step), an insulation film is formed on the wafer surface. In step 813 (electrode formation step), electrodes are formed on the wafer by vapor deposition. In step 814 (ion implantation step), ions are implanted in the wafer. The above mentioned steps 811-814 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 815 (photoresist formation step), photoresist is applied to a wafer. Next, in step 816 (exposure step), the above-mentioned exposure device is used to transfer the circuit pattern of a mask (reticle) to a wafer. Then in step 817 (developing step), the exposed wafer is developed, and in step 818 (etching step), parts other than residual photoresist (exposed material surface) are removed by etching. In step 819 (photoresist removal step), unnecessary photoresist remaining after etching is removed.

Multiple circuit patterns are formed by repetition of these preprocessing and post-processing steps.

As provided herein, in one embodiment, the circulation system maintains the outer surface of each motor at a set temperature. This reduces the effect of the motors on the temperature of the surrounding environment. This also allows the measurement system to take accurate measurements of the position of the stages. As a result thereof, the quality of the integrated circuits formed on the wafer is improved.

It should be noted that the Figures illustrate flow of the first fluid and the second fluid in the same direction. Alternatively, in each embodiment, the fluids can be arranged to flow in opposite directions, orthogonal to each other, or at another angle relative to each other. Additionally, while some of the embodiments show a single circulation system for each actuator, a circulation system could be used to cool multiple actuators, a portion of a circulation system could be used for multiple actuators while multiple copies of the other portion of the circulation system could each be used for a single actuator, or multiple circulation systems could be used for a single actuator.

While the particular mover combination 26 as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A mover combination comprising:
a mover including an outer surface, the mover including a magnet component and a conductor component, the mover defining a first passageway and a second passageway including an inlet, the first passageway at least partly encircling a portion of the second passageway, wherein the passageways are positioned within the conductor component; and
a circulation system comprising a fluid source that directs a first fluid to the first passageway and a second fluid to the second passageway, wherein the fluid source controls the temperature and flow of the first fluid so that the temperature of the outer surface is approximately equal to an ambient temperature, and wherein the second fluid is approximately boiling at the inlet.

2. The mover combination of claim 1 wherein the second fluid is within approximately 5 degrees C. of boiling at the inlet.

3. The mover combination of claim 2 wherein the second fluid is within approximately 1 degree C. of boiling at the inlet.

4. The mover combination of claim 1 wherein the mover is positioned in a room that is at a room temperature, and wherein the temperature of the first fluid at the first inlet is approximately equal to the room temperature.

5. The mover combination of claim 1 wherein the second passageway includes an outlet, wherein the second fluid that exits from the outlet is at a temperature that is approximately boiling.

6. The mover combination of claim 1 wherein the circulation system creates at least a partial vacuum in at least one of the passageways.

7. The mover combination of claim 1 wherein the circulation system creates at least a partial vacuum in the second passageway.

8. The mover combination of claim 1 wherein the mover is a linear motor.

9. An isolation system including the mover combination of claim 1.

10. A stage assembly including the mover combination of claim 1.

11. An exposure apparatus including the mover combination of claim 1.

12. A method for making an object comprising the steps of providing a substrate, and transferring an image on the substrate with the exposure apparatus of claim 11.

13. A method for making a semiconductor wafer comprising the steps of providing a substrate, and transferring an image on the substrate with the exposure apparatus of claim 11.

14. A mover combination comprising:
a mover including a magnet component, and a conductor component having a coil assembly, the mover also including a first passageway and a sealed second passageway, the second passageway being filled with a second fluid that is not actively circulated; wherein the passageways are positioned within the conductor component, wherein the first passageway encircles the coil assembly and the second passageway, and wherein the second passageway encircles the coil assembly; and
a fluid source that circulates a first fluid through the first passageway.

15. The mover combination of claim 14 wherein the second fluid is a gas.

16. The mover combination of claim 15 further comprising a heat transferer that is in direct thermal communication with the conductor component and transfers heat from the conductor component.

17. The mover combination of claim 16 wherein the mover includes a third passageway and the heat transferer transfers heat from the conductor component to the third passageway.

18. The mover combination of claim 17 wherein the fluid source circulates a third fluid through the third passageway.

19. The mover combination of claim 17 wherein the heat transferer includes a heat pipe.

20. The mover combination of claim 17 wherein the heat transferer includes a thermally conductive structure.

21. The mover combination of claim 14 wherein the mover is positioned in a room that is at a room temperature, and wherein a temperature of the first fluid in the first passageway is approximately equal to the room temperature.

22. An isolation system including the mover combination of claim 11.

23. A stage assembly including the mover combination of claim 14.

24. An exposure apparatus including the mover combination of claim 14.

25. A method for making an object comprising the steps of providing a substrate, and transferring an image on the substrate with the exposure apparatus of claim 24.

26. A method for making a semiconductor wafer comprising the steps of providing a substrate, and transferring an image on the substrate with the exposure apparatus of claim 24.

27. A method for making a mover combination, the method comprising the steps of: (i) providing a mover having an outer surface, a magnet component and a conductor component, the mover including a first passageway having a first inlet and a second passageway having a second inlet, the first passageway at least partly encircling a portion of the second passageway; wherein the passageways are positioned within the conductor component; and (ii) controlling the temperature of the outer surface of the mover so that it is approximately equal to an ambient temperature by directing a first fluid from a fluid source into the first inlet; and directing a second fluid from the fluid source into the second inlet, wherein a temperature of the second fluid at the second inlet is approximately equal to the boiling temperature of the second fluid at an absolute pressure within the second passageway.

28. The method of claim 27 wherein the temperature of the second fluid at the second inlet is within at least approximately 2 degrees C. of the boiling temperature of the second fluid at an absolute pressure within the second passageway.

29. The method of claim 27 wherein the temperature of the second fluid at the second inlet is within at least approximately 1 degrees C. of the boiling temperature of the second fluid at an absolute pressure within the second passageway.

30. The method of claim 29 wherein the second passageway includes a second outlet and wherein the temperature of the second fluid at the second outlet is within at least approximately 1 degree C. of the boiling temperature of the second fluid at an absolute pressure within the second passageway.

31. The method of claim 27 wherein the mover is positioned in a room that is at a room temperature, and wherein the temperature of the first fluid at the first inlet is approximately equal to the room temperature.

32. A method for making an isolation system comprising the steps of providing a mover and circulating the fluids around the mover pursuant to the method of claim 27.

33. A method for making a stage assembly comprising the steps of providing a mover that moves a stage and circulating the fluids around the mover pursuant to the method of claim 27.

34. A method for making an exposure apparatus comprising the steps of providing a mover and circulating the fluids around the mover pursuant to the method of claim 27.

35. A method of making a wafer utilizing the exposure apparatus made by the method of claim 34.

36. A method for controlling the temperature of a mover, the mover including a magnet component and a conductor component having a coil assembly, the method comprising the steps of:
providing a first passageway in the conductor component of the mover, the first passageway encircling the coil assembly;
providing a sealed second passageway in the conductor component of the mover between the first passageway and the coil assembly, the second passageway being filled with a second fluid that is not actively circulated; and
circulating a first fluid from a fluid source through the first passageway.

37. The method of claim 36 further comprising the step of transferring heat from a conductor array of the conductor component with a heat transferer.

38. The method of claim 37 including the step of providing a third passageway in the mover and wherein the step of transferring heat includes transferring heat from the conductor component to the third passageway with the heat transferer.

39. The method of claim 38 further comprising the step of circulating a third fluid through the third passageway.

40. The method of claim 37 wherein the heat transferer includes a heat pipe.

41. The method of claim 37 wherein the heat transferer includes a thermally conductive structure.

42. A method for making an isolation system comprising the steps of providing a mover and circulating the fluids around the mover pursuant to the method of claim 36.

43. A method for making a stage assembly comprising the steps of providing a mover that moves a stage and circulating the fluids around the mover pursuant to the method of claim 36.

44. A method for making an exposure apparatus comprising the steps of providing a mover and circulating the fluids around the mover pursuant to the method of claim 36.

45. A method of making a wafer utilizing the exposure apparatus made by the method of claim 44.

46. A method of making a device utilizing the exposure apparatus made by the method of claim 44.

47. A method for making a mover combination, the method comprising the steps of: (i) providing a mover having a magnet component and a conductor component and (ii) controlling the temperature of the mover with the method of claim 36.

48. The method of claim 47 wherein the mover is positioned in a room that is at a room temperature, and wherein the temperature of the first fluid at a first inlet to the first passageway is approximately equal to the room temperature.

49. A mover combination comprising:
a mover including an outer surface, a magnet component and a conductor component that is movable relative to the magnet component, wherein the conductor component has a first passageway and a second passageway that is at least partly encircled by the first passageway; and
a circulation system comprising a fluid source that directs a first fluid to the first passageway and a second fluid to the second passageway through an inlet to the second passageway, wherein the fluid source controls the temperature and flow of the second fluid so that the second fluid is approximately boiling at the inlet.

50. The mover combination of claim 49 wherein the fluid source controls the temperature and flow of the first fluid so that the temperature of the outer surface is approximately equal to an ambient temperature.

51. The mover combination of claim 49 wherein the second fluid is within approximately 5 degrees C. of boiling at the inlet.

52. The mover combination of claim 49 wherein the second fluid is within approximately 1 degree C. of boiling at the inlet.

53. The mover combination of claim 49 wherein the second passageway includes an outlet, wherein the second fluid that exits from the outlet is at a temperature that is approximately boiling.

54. A mover combination comprising:
a mover including a magnet component, and a conductor component, the mover also including a first passageway, a sealed second passageway that is filled with a second fluid that is not actively circulated, and a third passageway, wherein the first passageway and the second passageway are positioned within the conductor component;
a fluid source that circulates a first fluid through the first passageway; and
a heat transferer that is in direct thermal communication with the conductor component and transfers heat from the conductor component to the third passageway.

55. The mover combination of claim 54 wherein the fluid source circulates a third fluid through the third passageway.

56. The mover combination of claim 54 wherein the heat transferer includes a heat pipe.

57. The mover combination of claim 54 wherein, the heat transferer includes a thermally conductive structure.

58. A method for controlling the temperature of a mover, the mover including a magnet component and a conductor component, the method comprising the steps of:
providing a first passageway in the conductor component of the mover, the first passageway having a first inlet;
circulating a first fluid from a fluid source through the first passageway;
providing a sealed second passageway in the conductor component of the mover, the second passageway being filled with a second fluid that is not actively circulated;
providing a third passageway in the mover; and
transferring heat from a conductor array of the conductor component to the third passageway with a heat transferer.

59. The method of claim 58 further comprising the step of circulating a third fluid through the third passageway.

60. A mover combination comprising:
a mover including an outer surface, the mover defining a first passageway and a second passageway including an inlet, the first passageway at least partly encircling a portion of the second passageway; wherein the mover includes a magnet component having a pair of spaced apart magnet arrays and a conductor component that includes a conductor array postioned between the magnet arrays; and
a circulation system comprising a fluid source that directs a first fluid tot he first passageway and a second fluid to the second passageway, wherein the fluid source controls the temperature and flow of the first fluid so that the temperature of the outer surface is approximately equal to an ambient temperature, and wherein the second fluid is approximately boiling at the inlet.

61. A mover combination comprising:
a mover including an outer surface, the mover defining a first passageway and a second passageway including an inlet, the first passageway at least partly encircling a portion of the second passageway; wherein the mover is a voice coile motor; and
a circulation system comprising a fluid source that directs a first fluid to the first passageway and a second fluid to the second passageway, wherein the fluid source controls the temperature and flow of the first fluid so that the temperature of the outer surface is approzimately equal to an ambient temperature, and wherein the second fluid is approximately boiling at the inlet.

\* \* \* \* \*

UNITED STATES PATENT AND TRADEMARK OFFICE
CERTIFICATE OF CORRECTION

| | | |
|---|---|---|
| PATENT NO. | : 7,355,308 B2 | Page 1 of 1 |
| APPLICATION NO. | : 10/646848 | |
| DATED | : April 8, 2008 | |
| INVENTOR(S) | : Andrew J. Hazelton | |

It is certified that error appears in the above-identified patent and that said Letters Patent is hereby corrected as shown below:

On the Title Page (56)
In the Foreign Patent Documents:

Column 2, Line 18, delete "JP 10-313568" and substitute -- JP 10-313566 --.

In the Claims:

Column 21, Line 6, delete "11" and substitute -- 14 --.

Column 24, Line 19, delete "tot he" and substitute -- to the --.

Column 24, Line 28, delete "coile" and substitute -- coil --.

Signed and Sealed this

Second Day of September, 2008

JON W. DUDAS
*Director of the United States Patent and Trademark Office*